United States Patent
Naito et al.

(10) Patent No.: US 8,420,416 B2
(45) Date of Patent: Apr. 16, 2013

(54) METHOD OF MANUFACTURING ORGANIC ELECTROLUMINESCENT ELEMENT AND WHITE LIGHT-EMITTING ORGANIC ELECTROLUMINESCENT ELEMENT

(75) Inventors: Mitsuyoshi Naito, Osaka (JP); Tomoyuki Nakayama, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 266 days.

(21) Appl. No.: 12/934,302

(22) PCT Filed: Jun. 24, 2009

(86) PCT No.: PCT/JP2009/061481
§ 371 (c)(1),
(2), (4) Date: Sep. 24, 2010

(87) PCT Pub. No.: WO2009/157477
PCT Pub. Date: Dec. 30, 2009

(65) Prior Publication Data
US 2011/0017987 A1   Jan. 27, 2011

(30) Foreign Application Priority Data
Jun. 26, 2008   (JP) ................... 2008-167115

(51) Int. Cl.
*H01L 21/00* (2006.01)
(52) U.S. Cl.
USPC ........ 438/29; 257/E51.013; 257/79; 313/364; 315/375

(58) Field of Classification Search .................... 438/29, 438/780
See application file for complete search history.

(56) References Cited

U.S. PATENT DOCUMENTS

| 2005/0040392 | A1* | 2/2005 | Wu et al. ................. 257/40 |
| 2009/0091253 | A1* | 4/2009 | Yasukawa et al. ........ 313/504 |

FOREIGN PATENT DOCUMENTS

| JP | 2002198172 | 7/2002 |
| JP | 2002203672 | 7/2002 |
| JP | 2004164943 | 6/2004 |
| JP | 2007005211 | 1/2007 |
| JP | 2007128663 | 5/2007 |
| JP | 2007266586 | 10/2007 |
| WO | 2006008976 | 1/2006 |
| WO | 2007119420 | 10/2007 |
| WO | 2008029729 | 3/2008 |

\* cited by examiner

*Primary Examiner* — Julio J Maldonado
*Assistant Examiner* — Sonya D McCall Shepard
(74) *Attorney, Agent, or Firm* — Lucas & Mercanti, LLP

(57) ABSTRACT

In the present invention, disclosed is a method of manufacturing an organic electroluminescent element in which at least an anode, a light emission layer and a cathode are laminated, wherein at least one light emission layer possesses two kinds of light-emitting dopants, the method comprising the step of conducting a process in which the organic EL element is subjected to an annealing treatment after forming at least the anode, the at least one light emission layer and the cathode as an element structure. By the method of the present invention, a stably manufacturable organic electroluminescent element exhibiting high light emission efficiency and long lifetime is possible to be prepared, and a white light-emitting organic electroluminescent element is suitably prepared.

5 Claims, 3 Drawing Sheets

LIGHT

METHOD OF MANUFACTURING ORGANIC ELECTROLUMINESCENT ELEMENT AND WHITE LIGHT-EMITTING ORGANIC ELECTROLUMINESCENT ELEMENT

This is a 371 of PCT/JP2009/061481 filed Jun. 24, 2009 which in turn claimed the priority of Japanese Patent Application No. 2008-167115 filed Jun. 26, 2008, both applications are incorporated by reference herein.

TECHNICAL FIELD

The present invention relates to a method of manufacturing an organic electroluminescent element, and the organic electroluminescent element. The present invention relates specifically to a method of manufacturing an organic electroluminescent element which can be prepared in a simple process, and exhibits improved light emission efficiency and lifetime, and a white light-emitting organic electroluminescent element.

BACKGROUND

Attention is focused on an organic EL element as a display device, because high luminance light emission can be produced at low voltage. The organic electroluminescent element is constituted in such a manner that an emission layer containing a light-emitting compound is sandwiched between a cathode and an anode. In the above element, electrons and holes are injected into the emission layer and are subjected to recombination, whereby exciton is generated. The foregoing organic electroluminescent element is an element from which light is emitted by utilizing light emission (fluorescence or phosphorescence) during deactivation of the resulting exciton.

A demand for a surface light-emitting element in small volume and low power consumption has been desired, and an electroluminescent element (hereinafter, abbreviated as "EL element") draws attention as one of the surface light-emitting elements.

And, the EL element is classified broadly into an inorganic electroluminescent element ("inorganic EL element") and an organic electroluminescent element ("organic EL element"), depending on the material constituting such an EL element.

Generally, the inorganic EL element emits light in such way that high electric field is acted to a light-emitting section, and electrons are accelerated in the high electric field to come into collision to emission center, whereby the light emission center is activated to emit light.

On the other hand, in an organic EL element, electrons and holes are respectively injected into a light emission layer from an electron injection electrode and a hole injection electrode, the organic material is raised to excited state via combination of the injected electrons and holes in the light emission layer, and light is emitted when the organic material come back from the excited state to the ground state. The organic EL element has an advantage, which is capable of lower voltage driving than that of the inorganic organic EL element.

It is expected to develop to a thin and flexible display and lighting usage utilizing advantage of surface light emission. In this case, a white light organic EL element is expected to be developed for back light of a liquid crystal display or lighting.

Several methods of constituting a light emission layer to produce the white light organic EL element are known. A method of preparing the light emission layer composed of plural layers each containing each of BGR emitting materials, and a method of preparing a single light emission layer containing BGR emitting materials are known.

Further, the element is subjected to an aging treatment to reduce fluctuation among organic EL elements, and a trial to obtain longer lifetime has been made (refer to Patent Documents 1 and 2).

However, there appears a problem such that even when in a white organic EL element possessing a light emission layer, annealing treatment conditions to stabilize luminance and color during aging are slightly different from each other, an organic EL element exhibiting stable performance can not be obtained, and fluctuation is produced among organic EL elements, whereby no organic EL element exhibiting stable performance can be prepared.

PRIOR ART DOCUMENT

Patent Document
Patent document 1: Japanese Patent Open to Public Inspection (O.P.I.) Publication No. 2002-203672
Patent document 2: Japanese Patent O.P.I. Publication No 2002-198172

DISCLOSURE OF THE INVENTION

Problems to be Solved by the Invention

It is an object of the present invention to provide a method of manufacturing a stably manufacturable organic electroluminescent element exhibiting high light emission efficiency and long lifetime, and a white light-emitting organic electroluminescent element prepared by the foregoing method.

Means to Solve the Problems

The above-described object of the present invention are accomplished by the following structures.

(Structure 1) A method of manufacturing an organic electroluminescent element in which at least an anode, a light emission layer and a cathode are laminated, wherein at least one light emission layer comprises two kinds of light-emitting dopants, the method comprising the step of conducting a process in which the organic electroluminescent element is subjected to an annealing treatment after forming at least the anode, the at least one light emission layer and the cathode as an element structure.

(Structure 2) The method of Structure 1, comprising the step of forming the at least one light emission layer by a coating process.

(Structure 3) The method of Structure 1 or 2, wherein the at least one light emission layer comprises a host compound, and at least one of the two kinds of light-emitting dopants is a compound represented by the following Formula (1):

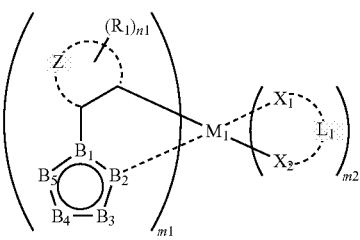

Formula (1)

where $R_1$ represents a substituent; Z represents a group of non-metal atoms to form a 5-membered ring to 7-membered ring; n1 represents an integer of 0-5: each of $B_1$-$B_5$ represents a carbon atom, a nitrogen atom, an oxygen atom or a sulfur atom; at least one of $B_1$-$B_5$ represents a nitrogen atom; $M_1$ represents a transition metal selected from groups 8-10 in the element periodic table; each of $X_1$ and $X_2$ represents a carbon atom, a nitrogen atom or an oxygen atom; $L_1$ represents a group of atoms to form a bidentate ligand together with $X_1$ and $X_2$; m1 represents an integer of 1-3; and m2 represents an integer of 0-2, provided that m1+m2 is equal to 2 or 3.

(Structure 4) The method of any one of Structures 1-3, comprising the step of conducting the annealing treatment via current.

(Structure 5) The method of any one of Structures 1-4, comprising the step of conducting the annealing treatment via heat.

(Structure 6) A white light-emitting organic electroluminescent element prepared by the method of any one of Structures 1-5.

Effect Of The Invention

Provided can be a method of manufacturing a stably manufacturable organic electroluminescent element exhibiting high light emission efficiency and long lifetime, and a white light-emitting organic electroluminescent element prepared by the foregoing method.

DESCRIPTION OF THE PREFERRED EMBODIMENTS

Figure 1:
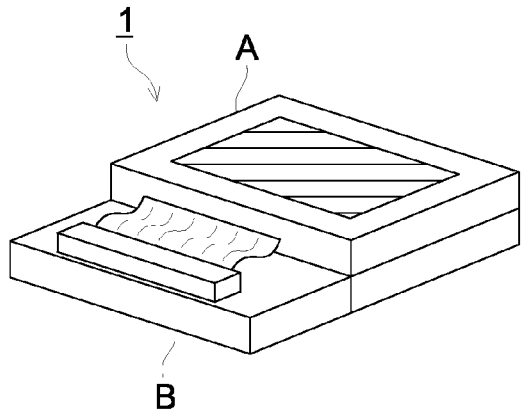
FIG. 1 is a schematic diagram showing an example

As to a method of manufacturing an organic EL element of the present invention, a method of manufacturing a stably manufacturable organic electroluminescent element exhibiting high light emission efficiency and long lifetime, and a white light-emitting organic electroluminescent element prepared by the foregoing method were able to be provided by utilizing a structure described in any one of Claims 1-5.

Next, details of constituent elements in the present invention will be described in order.

After considerable effort during intensive studies with respect to the above-described problem, the inventors have found out that a white organic EL element possessing at least one of light emission layers exhibits reduced change in luminance and color of the organic EL element regardless of fluctuation in annealing treatment.

After further effort during intensive studies, the inventors have also found out that when an organic EL element, for which at least one of light emission layers is prepared by a coating process, is subjected to an annealing treatment (current or heat), lifetime of the element is largely improved.

In addition, in the case of plural light emission layers, it is preferable that at least one of the light emission layers contains two kinds of dopants, and an annealing treatment is carried out after forming the element, and it is further preferable that the at least one of the light emission layers is formed by a coating process. It is specifically preferable that all the light emission layers are formed by the coating process.

The reason is presumably that a light emission layer having been formed by the coating process is more amorphous in structure than a light emission layer having been formed by a commonly known evaporation method.

<<Method of Manufacturing Organic EL Element>>

The method of manufacturing an organic EL element of the present invention will be described. In addition, details of constituent layers of organic EL element in the present invention will be described later on.

It is a feature that the method of manufacturing an organic EL element of the present invention as described in Structure 1 is a method of manufacturing an organic EL element in which at least an anode, a light emission layer and a cathode are laminated, possessing the step of conducting a process in which the organic EL element is subjected to an annealing treatment, after layering the cathode, wherein the light emission layer is composed of a single layer containing at least two kinds of light-emitting dopants.

The annealing treatment of the present invention will be described.

The annealing treatment of the present invention means an annealing treatment conducted via current flowing by applying voltage to an organic EL element in which at least an anode, a light emission layer and a cathode; another annealing treatment conducted via heat applied to the organic EL element; or further another annealing treatment possessing the foregoing two kinds of annealing treatments used in combination.

(Annealing Treatment Via Current)

The annealing treatment via current in the present invention means a treatment in which current is applied until luminance reaches 75-95% of the initial luminance, but current is preferably applied until luminance reaches 80-90% of the initial luminance in view of stability in luminance during aging of an organic EL element, and improved stability in light emission color, and current is more preferably applied until luminance reaches 80-85% of the initial luminance.

(Annealing Treatment Via Heat)

The annealing treatment via heat in the present invention means a heat treatment conducted at lower temperature than Tg (glass transition temperature) of a material contained in each of layers constituting an organic EL element.

As a heat treating method, specifically, a heat treatment is preferably conducted at a heating temperature of 65-95° C., more preferably conducted at a heating temperature of 75-90° C., and most preferably conducted at a heating temperature of 85-90° C.

Further, a heating duration is preferably 10 minutes to 2 hours, and more preferably 30 minutes to one hour.

Concerning Tg (glass transition temperature) of an organic EL element material in the present invention, glass transition temperature (Tg) is a value obtained by a method in accordance with JIS-K-7121 employing DSC (Differential Scanning Calorimetry).

In the method of manufacturing an organic EL element of the present invention, at least one of light emission layers in the organic EL element (containing two kinds of light-emitting dopants) is preferably formed by a coating process (referred to also as a wet process, solution-coating or dispersion-coating).

Further, it is a preferred embodiment that constituent layers comprised in the after-mentioned organic EL element such as a light emission layer other than the above-described light emission layer, a hole injection layer, a hole transport layer, a hole blocking layer, an electron transport layer, an electron injection layer and so forth are also formed by a coating process.

<<Embodiment of Method of Manufacturing Organic EL Element of the Present Invention>>

Herein, an embodiment (an example) of a method of manufacturing an organic EL element of the present invention will be described.

As an embodiment (an example) of preparation of an organic EL element of the present invention, a method of manufacturing an organic EL element composed of anode/hole injection layer/hole transport layer/light emission layer/hole blocking layer/electron transport layer/electron injection layer/cathode will be described.

First, a thin film made of a desired electrode material such as an anode material, for example, is formed on a substrate via evaporation or sputtering so as to give a film thickness of not more than 1 μm, but preferably 10-200 nm to prepare an electrode on the anode side (also referred to simply as an anode).

Next, organic compound thin films (organic layers) such as a hole injection layer, a hole transport layer, a light emission layer, a hole blocking layer, an electron transport layer, an electron injection layer and so forth are formed thereon.

Examples of the method of forming each of these layers include an evaporation method, and a wet process method such as a spin coating method, a cast method, an inkjet method, a spray method or a printing method, but in the present invention, films are preferably formed by a coating process such as a spin coating method, an inkjet method, a spray method or a printing method, since uniform films are easy to be prepared, and pinholes are difficult to be generated.

When using an inkjet method or a spray method to mix a host solution and a guest solution having been prepared as each of independent solutions on a substrate, ejection is preferably conducted while moving either a nozzle or a substrate, or both of them in such a way that liquid droplets formed on the substrate are brought into contact with each other and mixed by ejecting each of the solutions.

In the present invention, as liquid media to dissolve or disperse an organic EL material during preparation of a coating solution (or possibly during preparation of a dispersion), employed may be, for example, ketones such as methyl ethyl ketone and cyclohexanone; fatty acid esters such as ethyl acetate; halogenated hydrocarbons such as dichlorobenzene; aromatic hydrocarbons such as toluene, xylene, mesitylene and cyclohexylbenzene; aliphatic hydrocarbons such as cyclohexane, decaline and dodecane; and organic solvents such as DMF and DMSO.

Further, as to a method of dispersing an organic EL element material, it is possible to achieve dispersion employing a dispersion method such as ultrasonic waves, high shearing force dispersion or media dispersion.

After forming this layer, a thin layer made of a cathode material is formed thereon via evaporation or sputtering so as to reach a film thickness of 1 μm or less, and preferably 50-200 nm to form a cathode, whereby a desired organic EL element is obtained.

Further, by reversing the preparation order, it is possible to prepare a cathode, an electron injection layer, an electron transport layer, a hole blocking layer, a light emission layer, a hole transport layer, a hole injection layer and an anode in this order.

When direct current voltage is applied to a multicolor display device obtained in this way, when the anode is employed as "+" polarity while the cathode is employed as "−" polarity, and a voltage of about 2-40 V is applied therein, light emission can be observed. Further, alternate current voltage may also be applied. The waveform of applied alternate current voltage may be arbitrary.

Next, each of constituent elements of an organic EL element of the present invention will be detailed in order.

<<Layer Structure of Organic EL Element>>

In the present invention, preferably specific examples of layer structure of the organic EL element will be listed below, but the present invention is not limited thereto.

(i) anode/light emission layer/cathode (ii) anode/hole transport layer/light emission layer/cathode (iii) anode/hole transport layer/light emission layer/electron emission layer/cathode (iv) anode/hole transport layer/light emission layer/hole blocking layer/electron emission layer/cathode (v) anode/hole injection layer/hole transport layer/light emission layer/hole blocking layer/electron emission layer/cathode buffer layer/cathode (vi) anode/hole injection layer/hole transport layer/hole transport layer A/light emission layer/electron emission layer/cathode buffer layer/cathode <<Light Emission Layer>>

The light emission layer of the present invention is a layer where electrons and holes, injected from electrodes, an electron transport layer or a hole transport layer, are recombined to emit light. The portions where light emits may be in the light emission layer or may be at the interface between the light emission layer and the layer adjacent thereto. The thickness of the light emission layer is not specifically limited. However, in view of improving layer uniformity and stability of light emission color against driving electric current without requiring unnecessary high voltage during light emission, the thickness is adjusted to be preferably in the range of 2-200 nm, and more preferably in the range of 5-100 nm.

Next, a light-emitting dopant contained in a light emission layer (referred to also as a light-emitting dopant compound) and a host compound will be described.

(Light-Emitting Dopant)

As a light-emitting dopant of the present invention, employed may be a fluorescent dopant (referred to also as a fluorescent compound) or a phosphorescence dopant (referred to also as a phosphorescent emitter, a phosphorescent compound or phosphorescence-emitting compound), but in view of preparation of an organic EL elements exhibiting higher light emission efficiency, for a light-emitting dopant (also referred to simply as a light-emitting material) employed as a light emission layer or a light emission unit in an organic EL element of the present invention, not only the after-mentioned host compound, but also a phosphorescence dopant is preferably contained.

A phosphorescence dopant (referred to also as a phosphorescence-emitting compound or the like) is a compound whose light emission from the excitation triplet is observed, and is specifically defined as a compound emitting phosphorescence at room temperature (25° C.), and having a phosphorescent quantum yield of 0.01 or more at 25° C. However, the phosphorescent quantum yield at 25° C. is preferably 0.1 or more.

The phosphorescent quantum yield can be measured in accordance with a method described in the fourth edition "Jikken Kagaku Koza 7", Bunko II, page 398 (1992) published by Maruzen. The phosphorescent quantum yield can be measured in a solution employing various kinds of solvents. In the case of a phosphorescence emission dopant in the present invention, it is desired that any of the solvents satisfies the above-described phosphorescent quantum yield (at least 0.01).

As a light-emitting dopant, at least one of compounds represented by Formula (1) is preferably used, and the compound represented by Formula (1) is preferably used as a phosphorescence dopant.

<<Compound Represented by Formula (1)>>

The compound represented by Formula (1) will be described.

Examples of substituents represented by $R_1$ in a compound represented by Formula (1) include an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group), an aromatic heterocyclic ring group (for example, a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazole-1-yl group, a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbonyl group, a diazacabazolyl group (exhibiting one in which one of carbon atoms constituting the carboline ring of the above-described carbolinyl group is replaced by a nitrogen atom), a quinoxalinyl group, a pyridazinyl group, a triazinyl group, a quinazolinyl group, and a phthalazinyl group), a heterocyclyl group (for example, a pyrrolidyl group, an imidazolidyl group, a molpholyl group, and an oxazolidyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group and a dodecylthio group), a cycloalkylthio group (for example, a cyclopentylthio group and a cyclohexylthio group), and arylthio group (for example, a phenylthio group and a naphthylthio group), an alkoxycarbonyl group (for example, a methyloxycarbonyl group, an ethyloxycarbonyl group, a butloxycarbonyl group, an octyloxycarbonyl group and a dodccyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexlaminosulfonyl group, cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexlcarbonylamino group, an octylcarbonylamino group, a dodecylcarbonylamino group, a phenylcarbonylamino group, and a naphthylcarbonylamino group), a carbamonyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexlaminocarbonyl group, a dodecylaminocarbonyl group, a phenylaminocarbonyl group, a naphthylaminocarbonyl group and a 2-pyridylaminocarbonyl group), an ureido group (for example, a methylureido group, an ethylueido group, a pentylureido group, a cyclohexlureido group, an octylureido group, a dodecylureido group, a phenylureido group, a naphthylureido group and a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group (for example, a methylsulfonyl group, an ethylsulfonyl group, a butyl sulfonyl group, a cyclohexylsulfonyl group, a 2-ethylhexylsulfonyl group and a dodecylsulfonyl group), an arylsulfonyl or heteroarylsulfonyl group (for example, a phenylsulfonyl group, a naphthylsulfonyl group, a 2-pyridyksulfonyl, group), an amino group (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group), a cyano group, a nitro group, a hydroxyl group, a mercapto group, a silyl group (for example, a trimethylsilyl group, a triisopropylsilyl group, a triphenylsilyl group, and a phenyldiethylsilyl group), and so forth.

Of these substituents, an alkyl group or an aryl group is preferable.

Z represents a group of non-metal atoms to form a 5-membered ring to 7-membered ring. Examples of the 5-membered ring to 7-membered ring formed by Z include a benzene ring, a naphthalene ring, a pyridine ring, a pyrimidines ring, a pyrrole ring, a thiophene ring, a pyrazole ring, an imidazole ring, an oxazole ring and a thiazole ring. Of these, a benzene ring is preferable.

$B_1$-$B_5$ each represent a carbon atom, a nitrogen atom, an oxygen atom or a sulfur atom, and at least one of them represents a nitrogen atom. A single ring is preferable as an aromatic nitrogen-containing heterocyclic ring composed of these 5 atoms. Examples thereof include a pyrrole ring, a pyrazole ring, an imidazole ring, a triazole ring, a tetrazole ring, an oxazole ring, an isoxazole ring, a thiazole ring, an isothiazole ring, an oxadiazole ring and a thiadiazole ring. Of these, preferable is a pyrazole ring or an imidazole ring, and more preferable is an imidazole ring.

These rings may be further substituted by the substituents described above. Those preferable as the substituent are an alkyl group and an aryl group, and more preferable as the substituent is an aryl group.

$L_1$ represents a group of atoms to form a bidentate ligand together with $X_1$ and $X_2$. Specific examples of the bidentate ligands represented by $X_1$-$L_1$-$X_2$ include a substituted or unsubstituted phenylpyridine, phenylpyrazole, phenylimidazole, phenyltriazole, phenyltetrazole, pyrazabole, picolinic acid, and acetylacetone.

These rings may be further substituted by the above-described substituents.

Symbol "m1" represents an integer of 1, 2, or 3, and symbol "m2" represents an integer of 0, 1, or 2, but "m1+m2" is equal to 2 or 3. Of these, the case where m2 represents 0 is preferred.

As the metal represented by $M_1$, employed are transition metal elements (also referred to simply as transition metals) of groups 8-10 in the element periodic table, but of these, iridium and platinum are preferable, and iridium is more preferable.

The compound represented by Formula (1) in the present invention may have a polymerizable group or a reactive group further as a substituent, and may not have a polymerizable group or a reactive group further as a substituent.

Specific examples of the dopant material represented by Formula (1) in the present invention are exemplified below, but the present invention is not limited thereto.

1-1
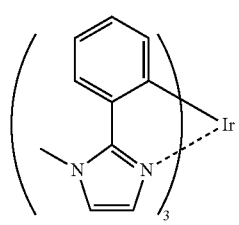

1-2
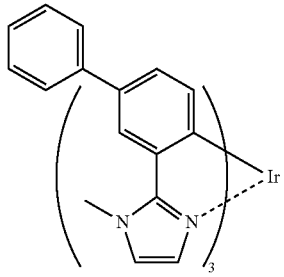

1-3
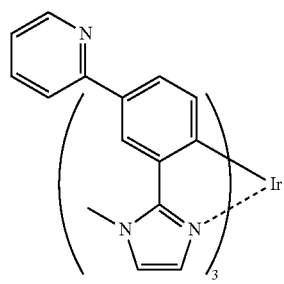

1-4
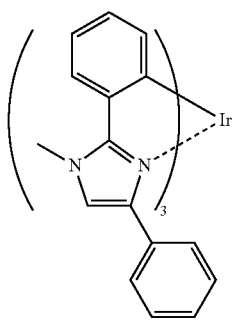

1-5
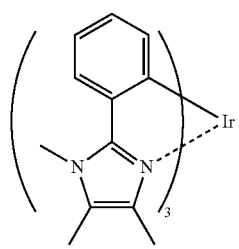

1-6
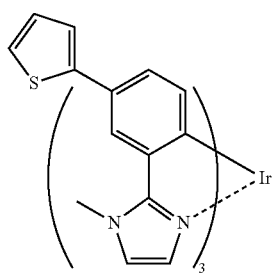

1-7
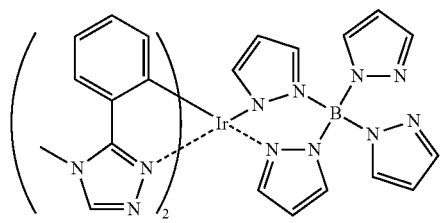

1-8
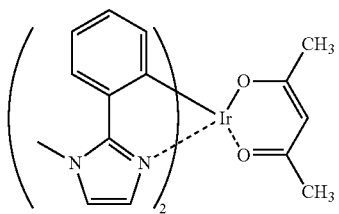

1-9
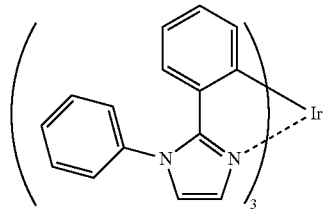

1-10
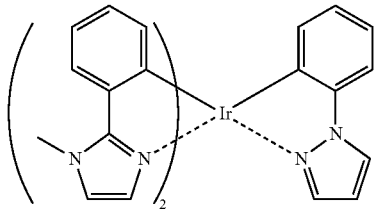

-continued
1-11
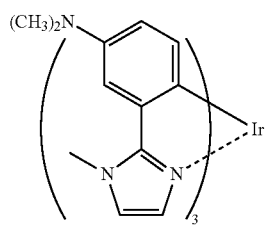
1-12
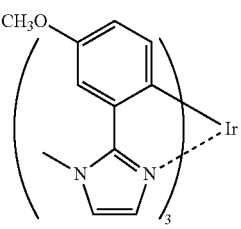
1-13
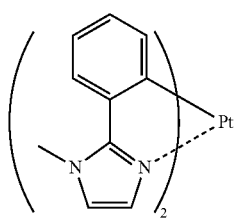
1-14
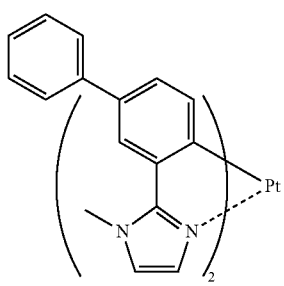
1-15
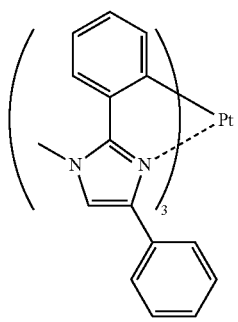
1-16
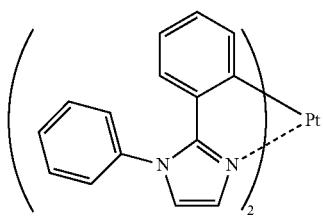
1-17
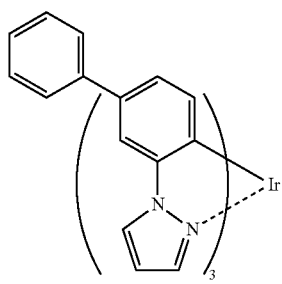
1-18
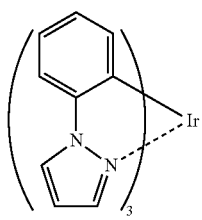
1-19
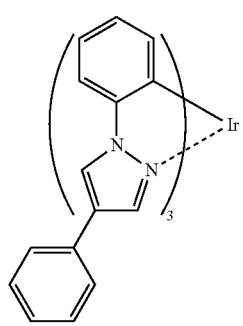
1-20
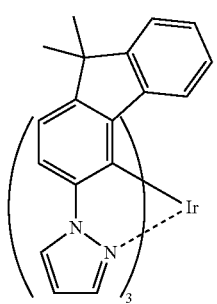

-continued
1-21
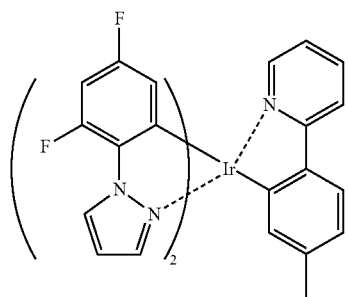
1-22
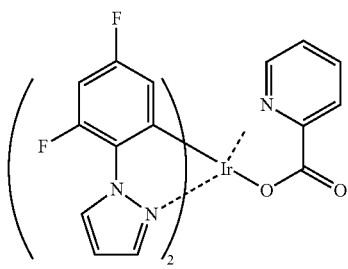
1-23
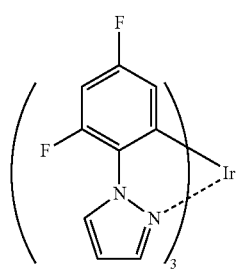
1-24
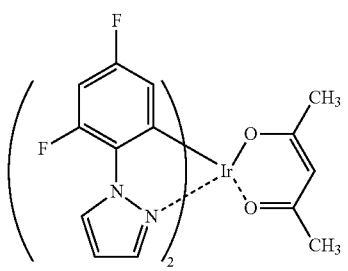
1-25
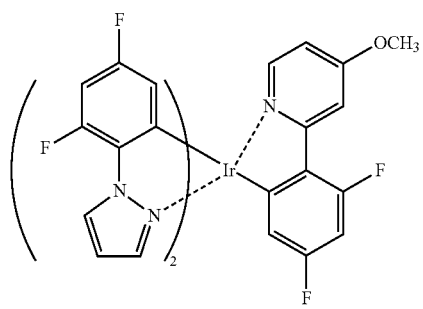
1-26
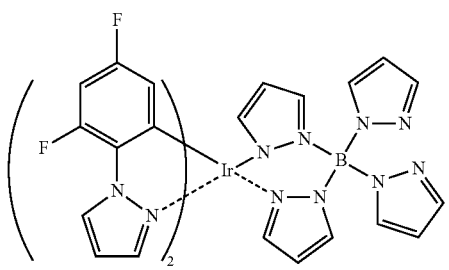
1-27
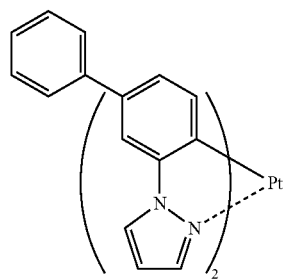
1-28
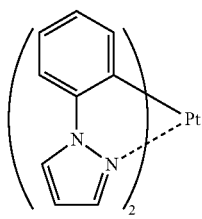
1-29
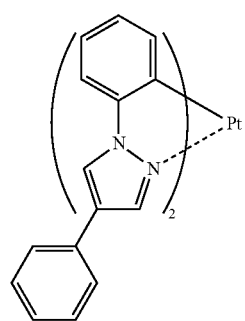
1-30
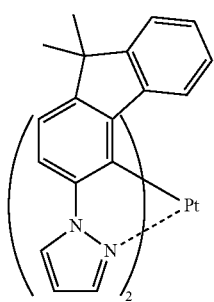

-continued
| | |
|---|---|
| 1-31 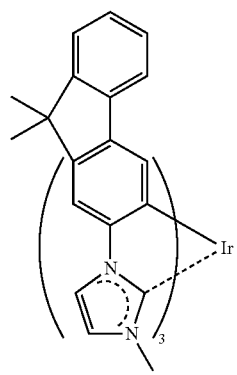 | 1-32 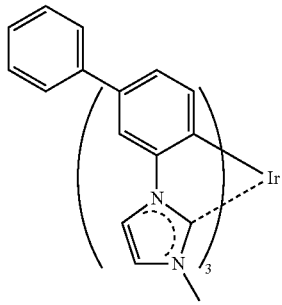 |
| 1-33 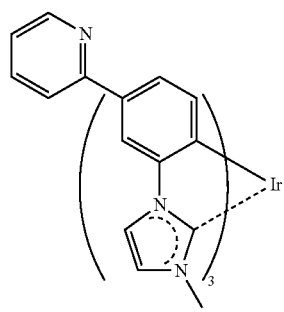 | 1-34 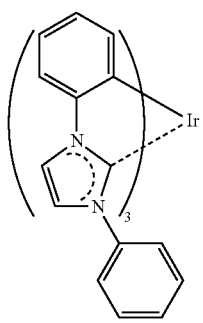 |
| 1-35 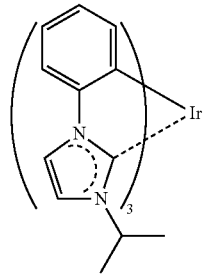 | 1-36 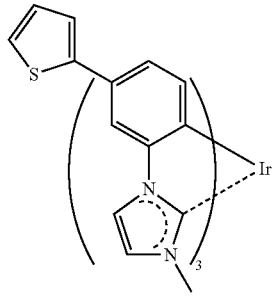 |
| 1-37 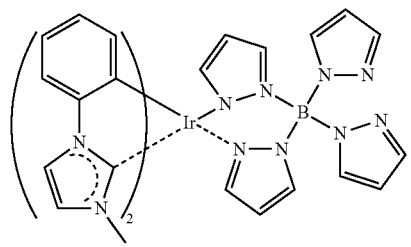 | 1-38 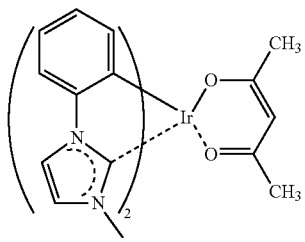 |
| 1-39 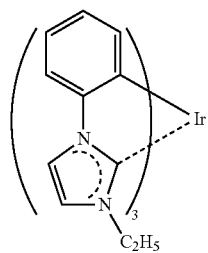 | 1-40 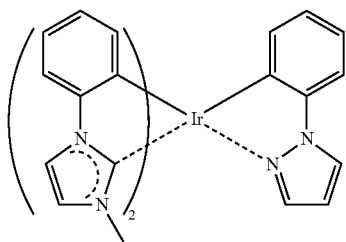 |

1-41 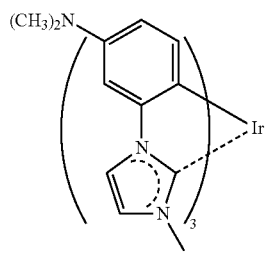
1-42 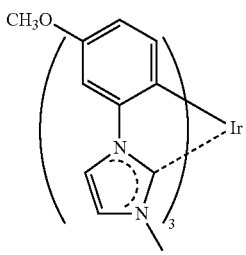
1-43 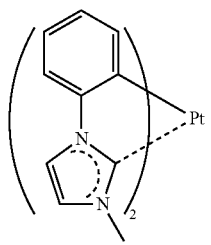
1-44 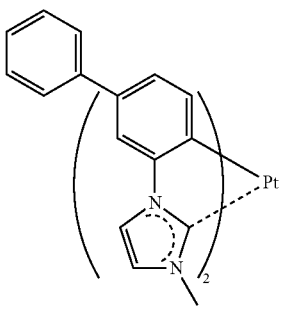
1-45 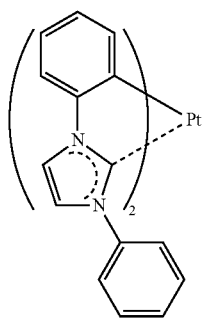
1-46 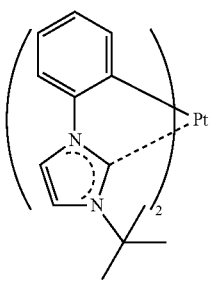
1-47 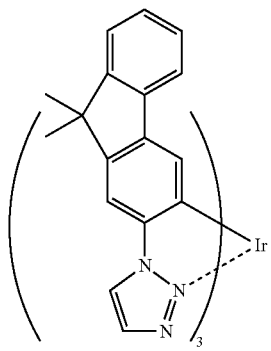
1-48 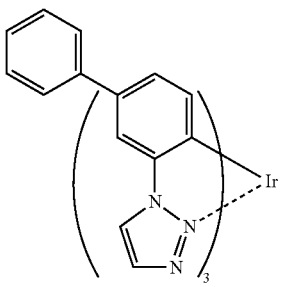
1-49 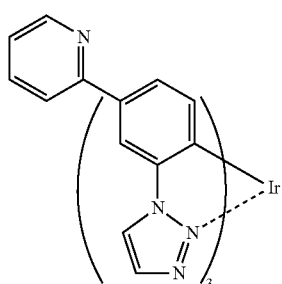
1-50 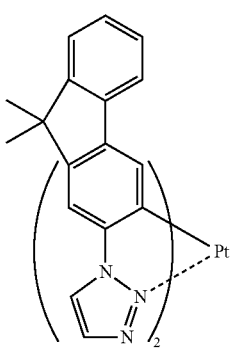

-continued
1-51
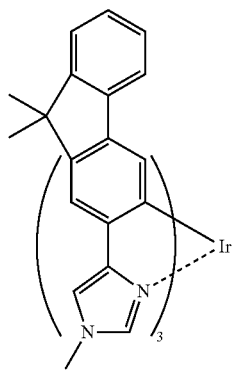
1-52
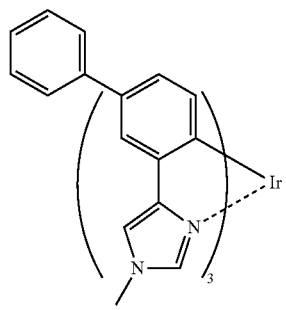
1-53
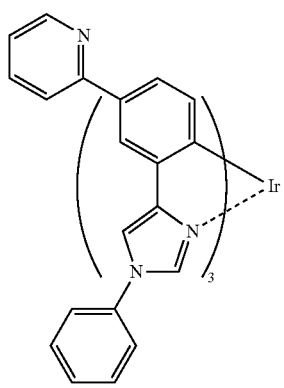
1-54
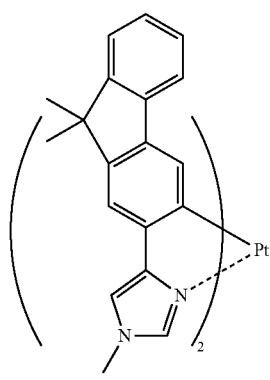
1-55
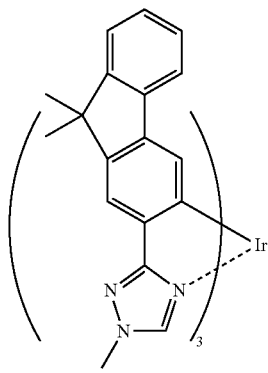
1-56
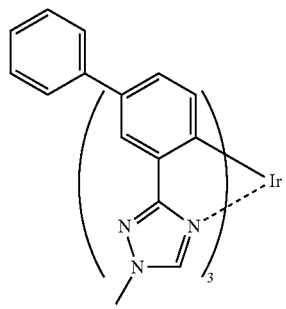
1-57
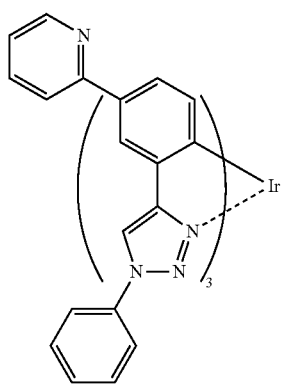
1-58
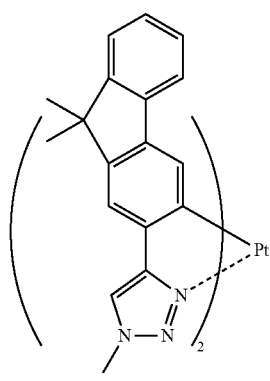

-continued
| | |
|---|---|
| 1-59 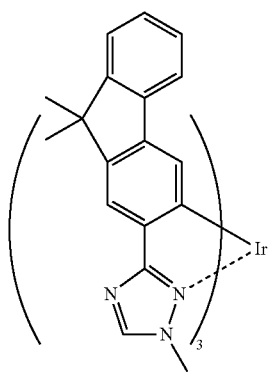 | 1-60 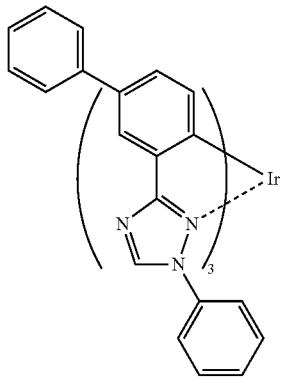 |
| 1-61 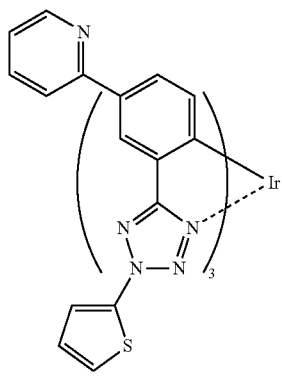 | 1-62 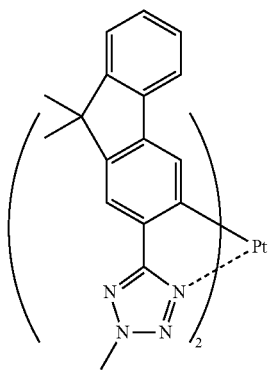 |
| 1-63 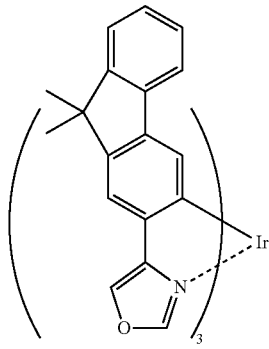 | 1-64 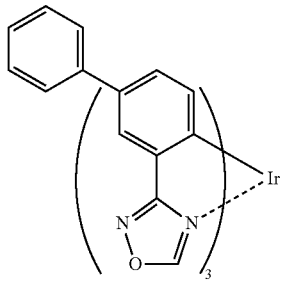 |
| 1-65 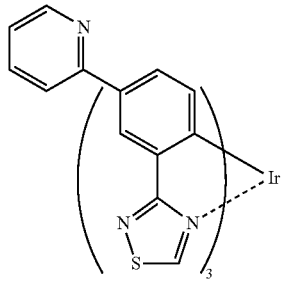 | 1-66 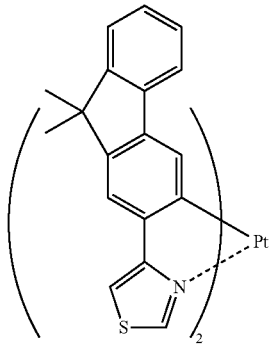 |

-continued
1-67
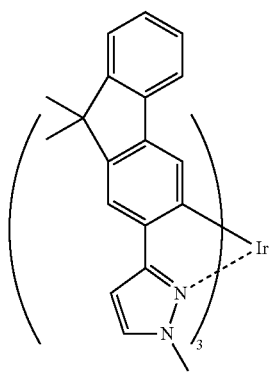
1-68
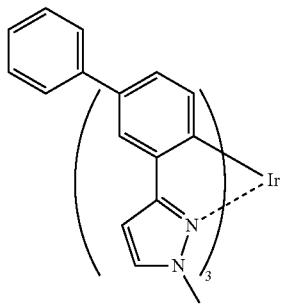
1-69
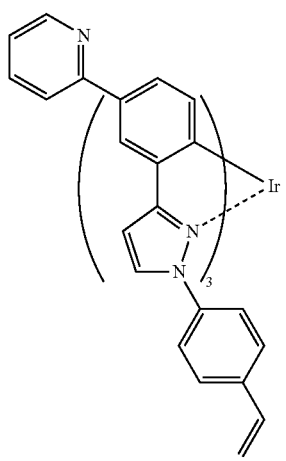
1-70
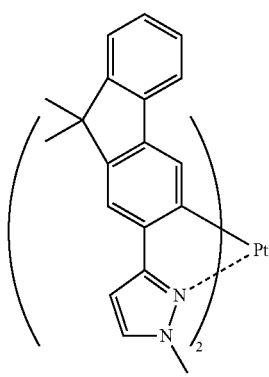
1-71
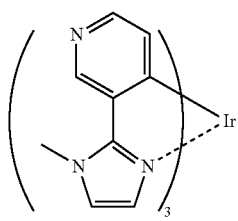
1-72
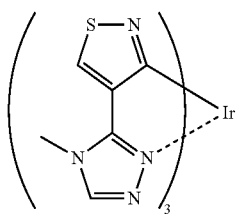
1-73
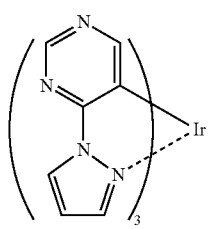
1-74
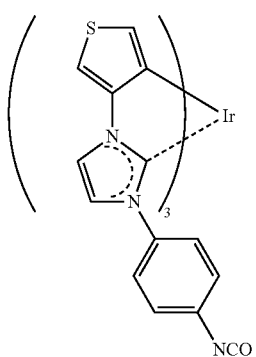

-continued
1-75
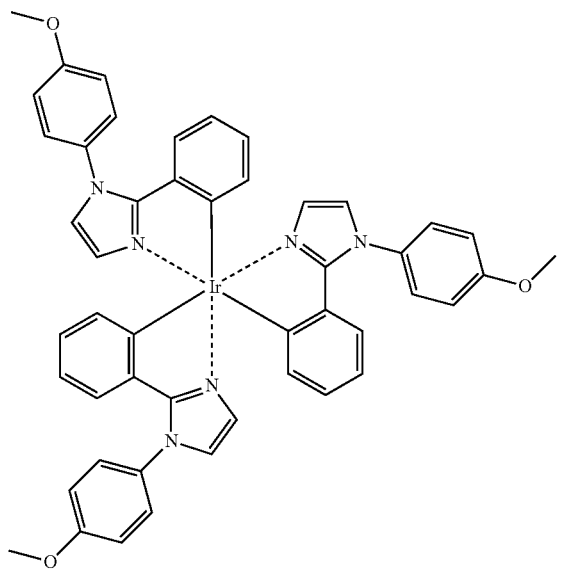
1-76
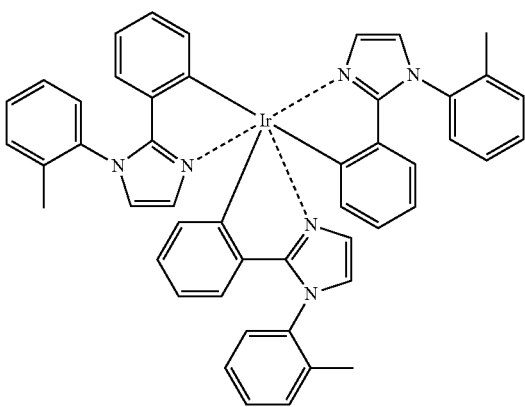
1-77
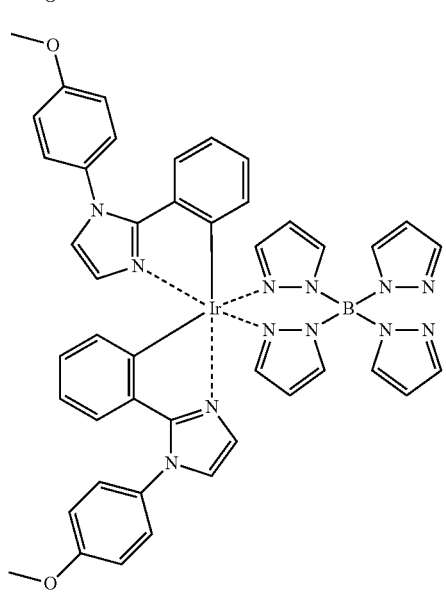
1-78
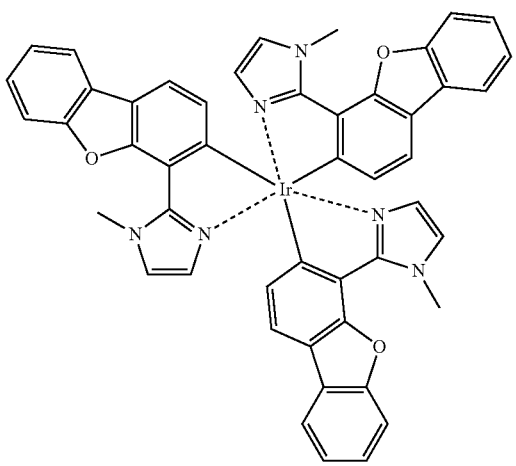
1-79
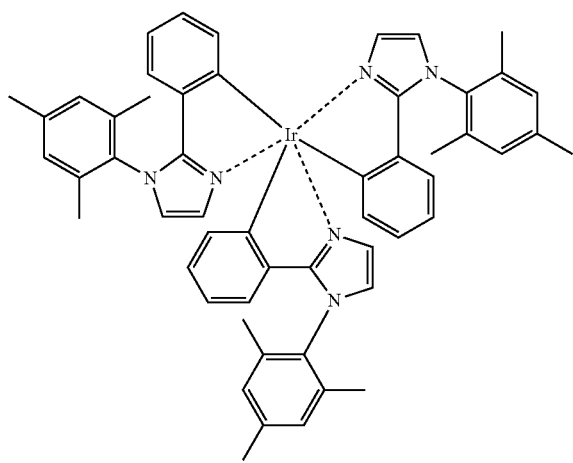
1-80
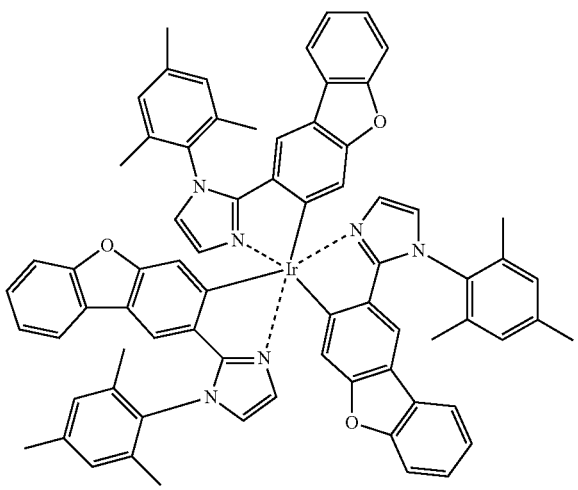

-continued
1-81
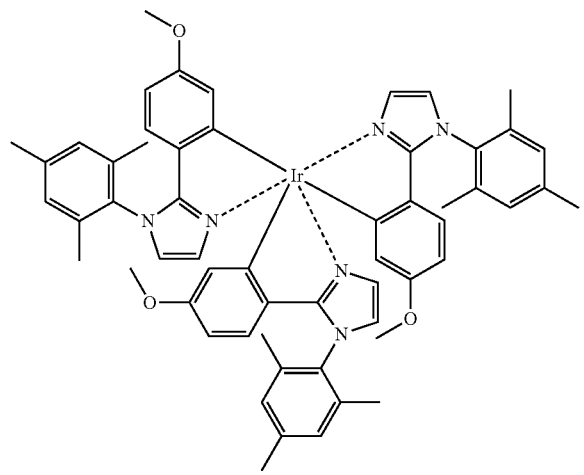
1-82
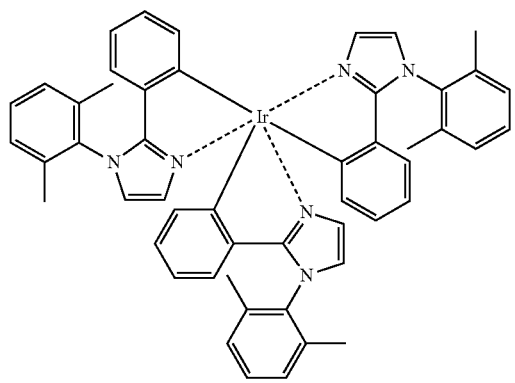
1-83
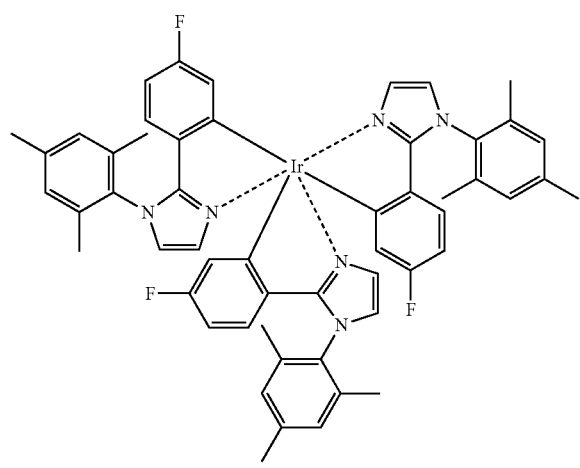
1-84
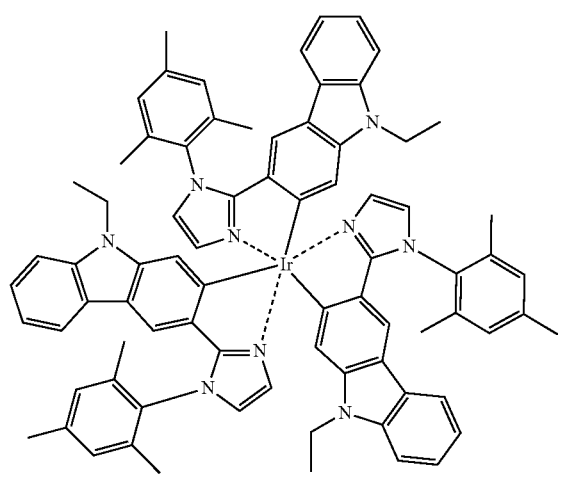
1-85
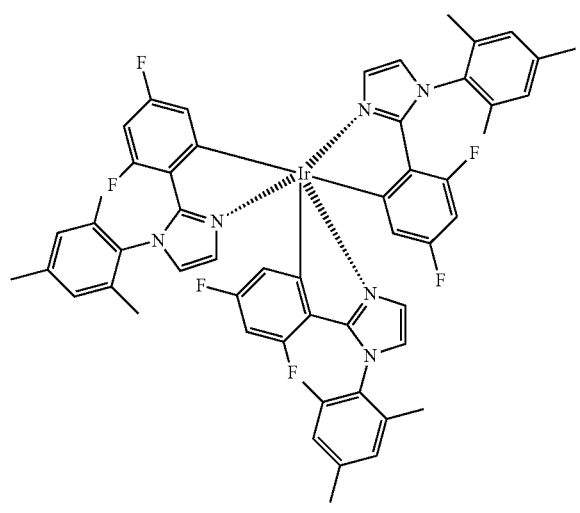
1-86
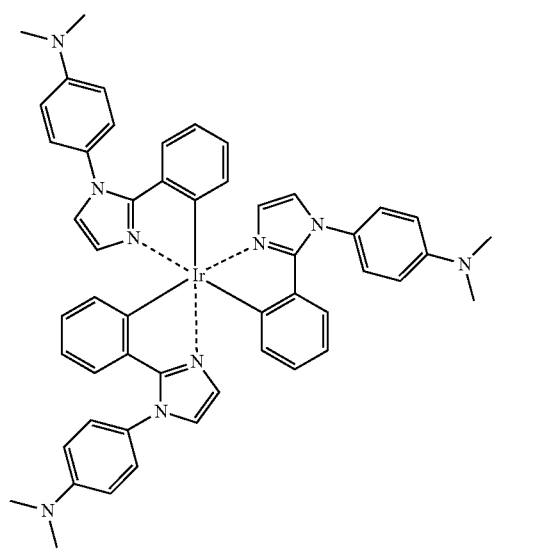

-continued
1-87
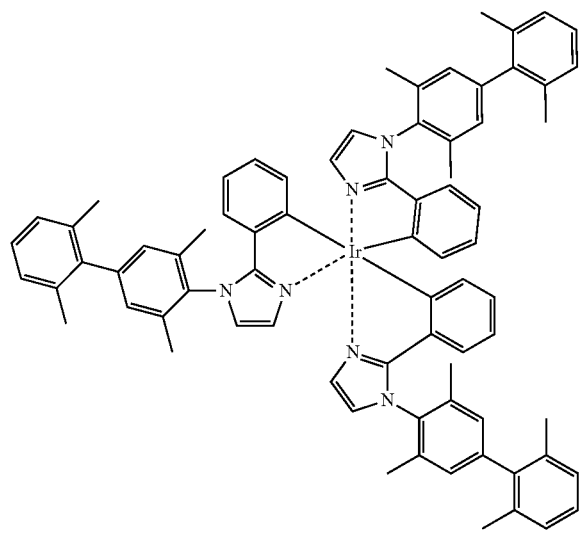
1-88
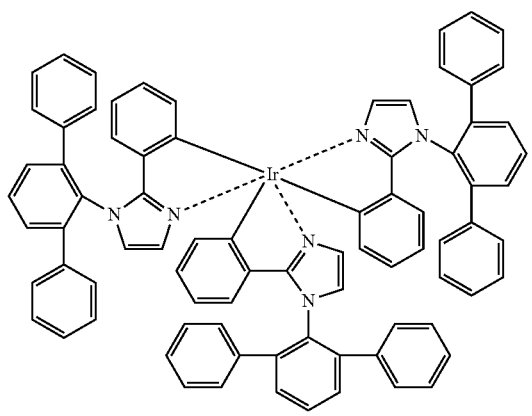
1-89
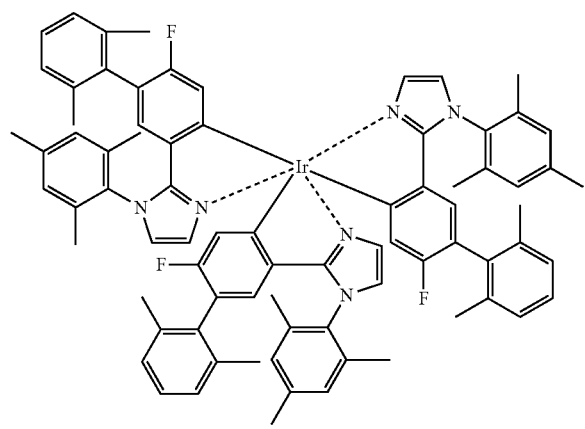
1-90
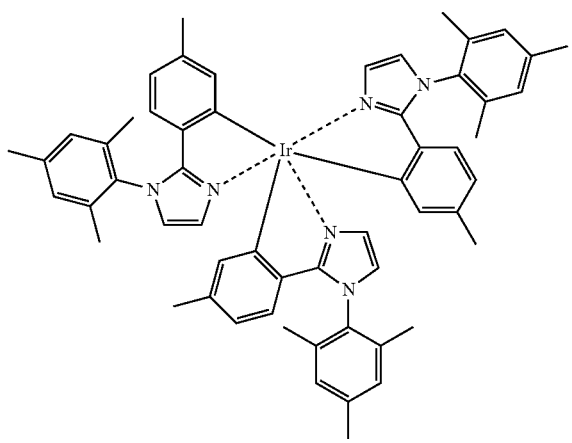
1-91
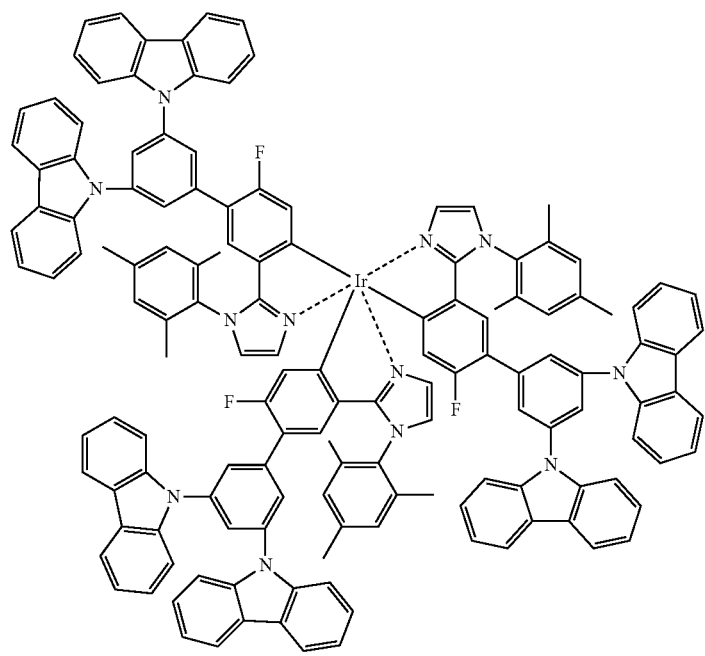

1-92
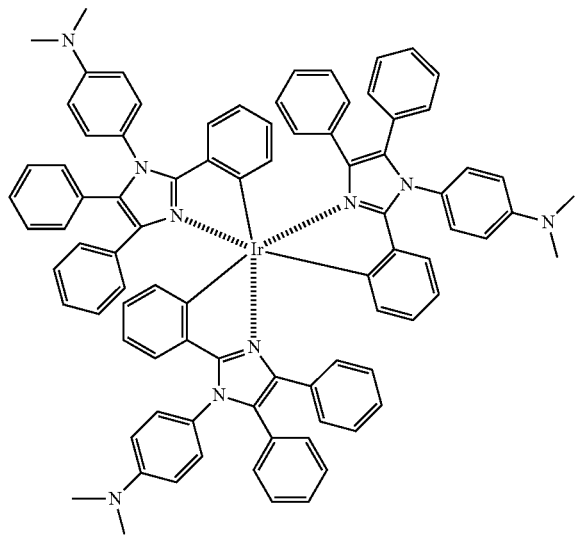
1-93
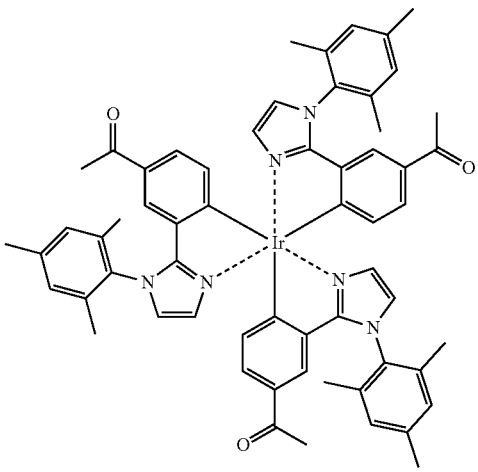
1-94
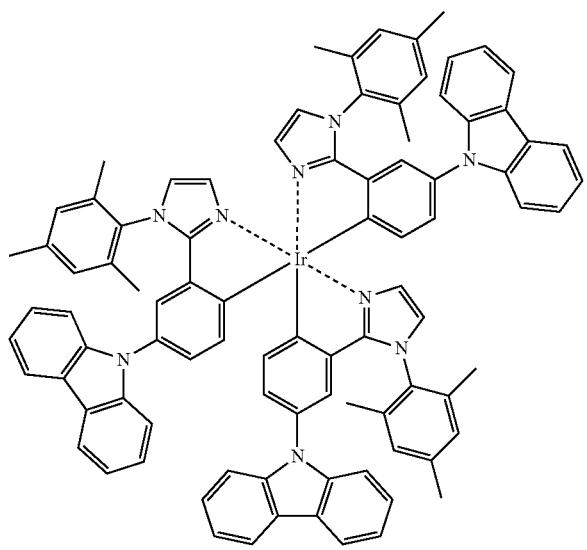
1-95
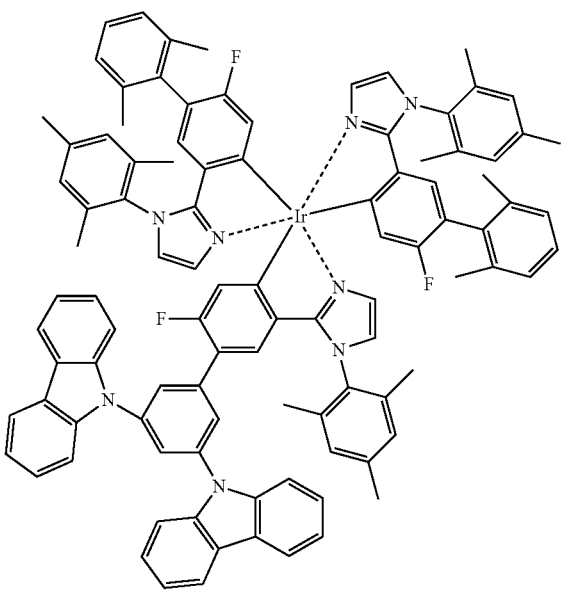

1-96
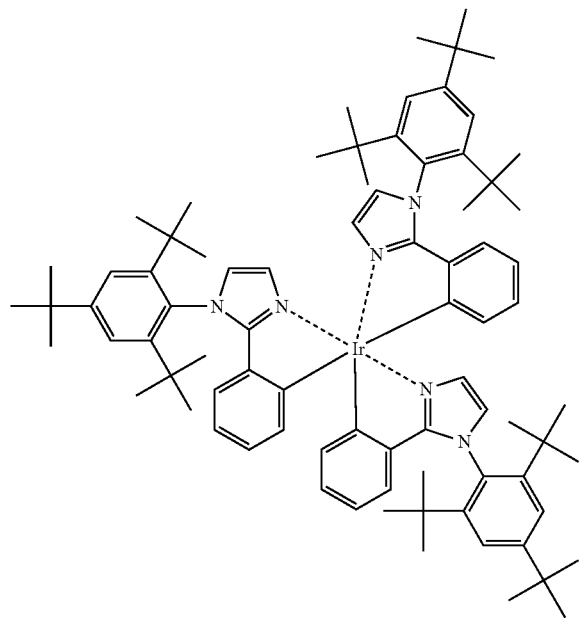
1-97
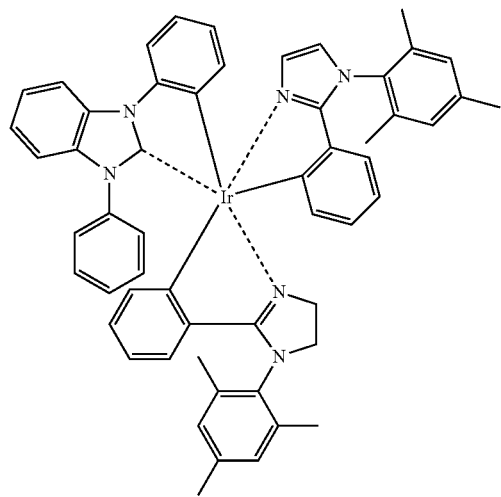
1-98
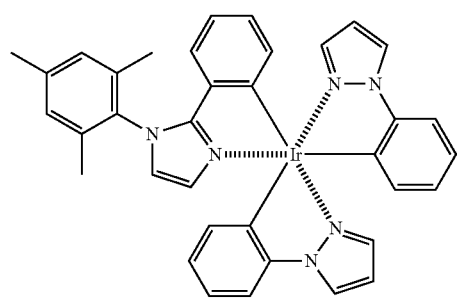
1-99
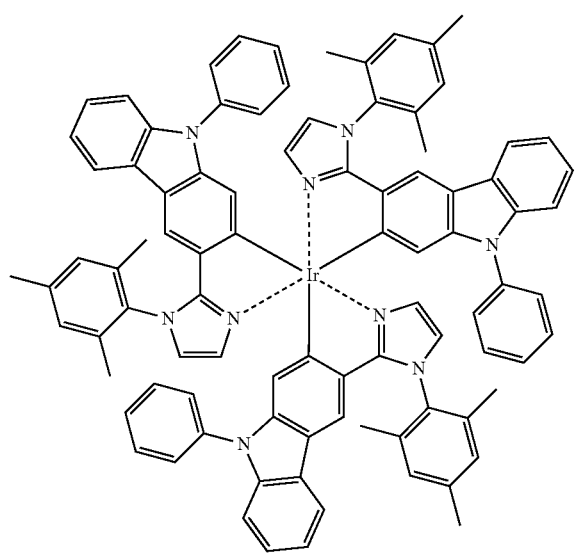

1-100
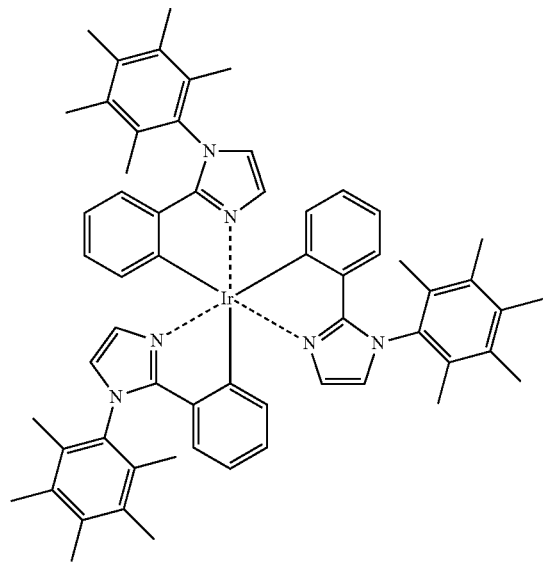
1-101
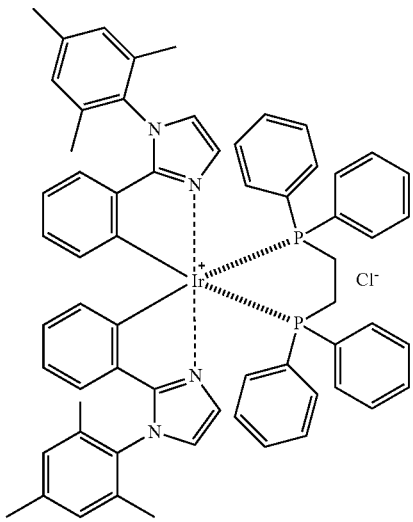
1-102
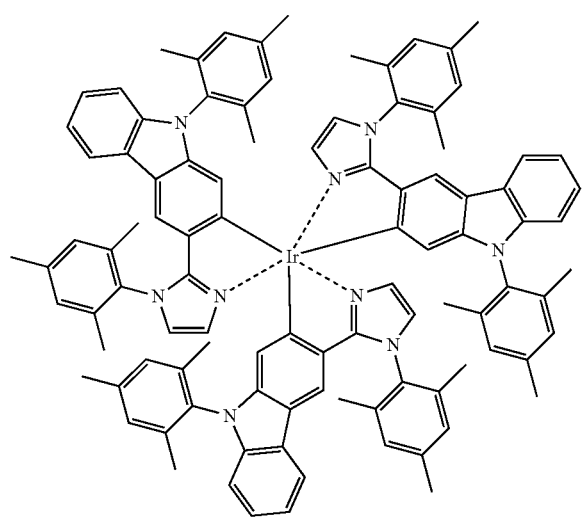
1-103
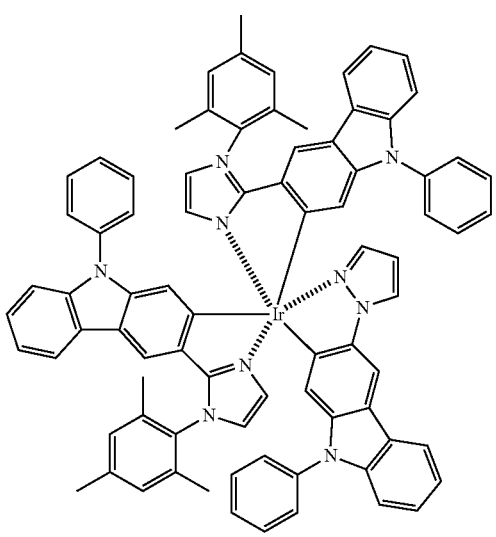

1-104
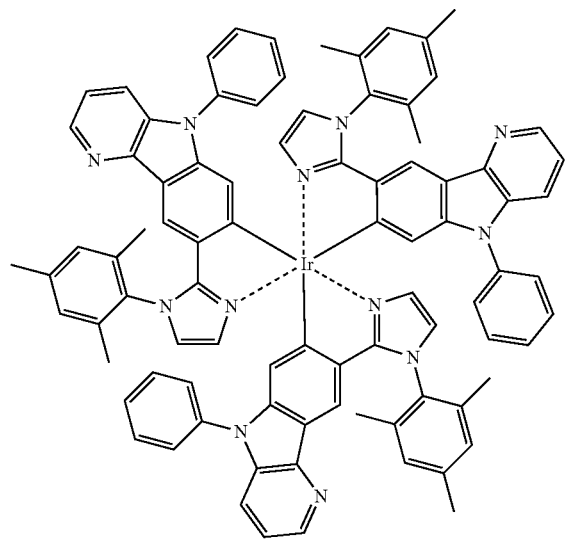
1-105
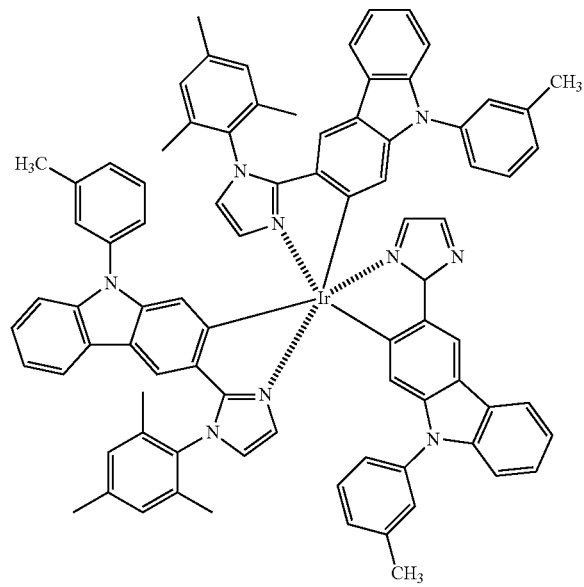
1-106
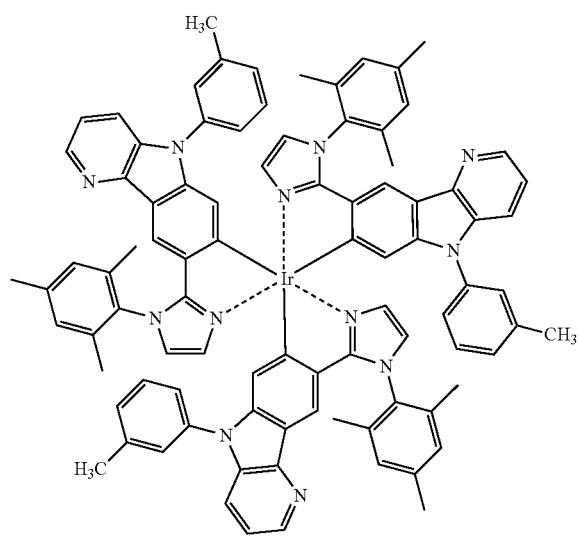
1-107
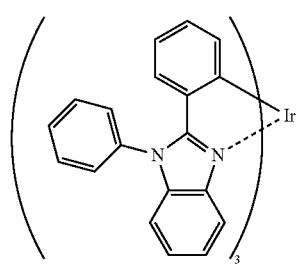
1-108
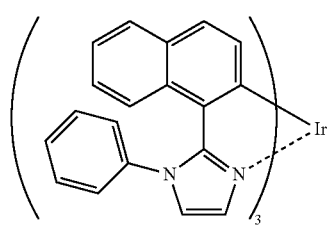
1-109
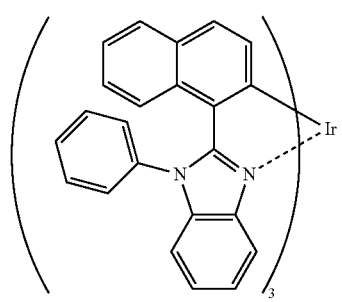

-continued

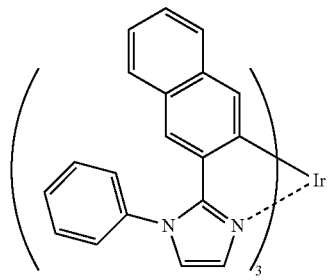
1-110

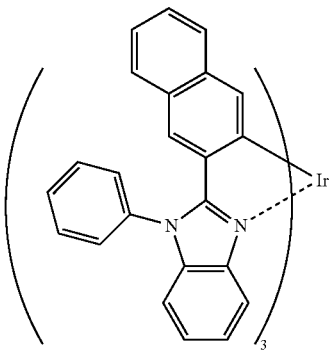
1-111

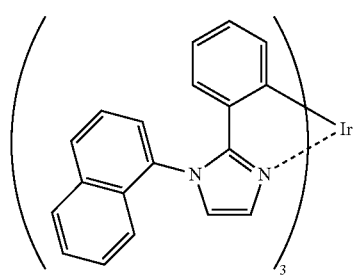
1-112

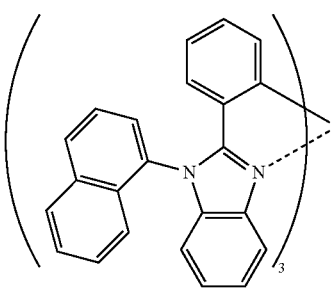
1-113

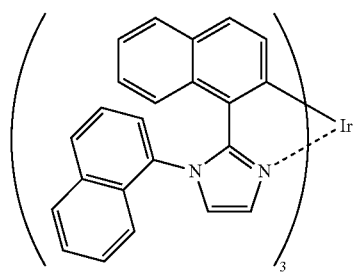
1-114

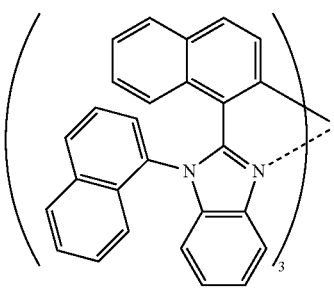
1-115

These metal complexes are disclosed, for example in Organic Letter, vol. 3, No. 16, pages 2,579-2,581, Inorganic Chemistry, vol. 30, No. 8, pages 1,685-1,687 (1991), J. Am. Chem. Soc., Volume 123, pages 4,304 (2001), Inorganic Chemistry, Volume 40, No. 7, pages 1,704-1,711 (2001), Inorganic Chemistry, vol. 41, No. 12, pages 3,055-3,066 (2002), New Journal of Chemistry, vol. 26, page 1, 171 (2002) and European Journal of Organic Chemistry, vol. 4, pages 695-709 (2004), and can be synthesized via application of the methods disclosed in the references cited in the foregoing literatures.

Further, plural kinds of commonly known dopant materials may be used in combination in addition to a compound represented by above-described Formula (1). Different kinds of light emission are possible to be mixed by using plural kinds of dopant material, whereby any light emission color can be obtained. White light emission becomes possible by adjusting kinds of dopant material and a doping amount, application to illumination and backlight is also possible.

As specific examples of commonly known dopant materials, listed are compounds described in the following patent documents.

WO 00/70655, Japanese Patent O.P.I. Publication No. 2002-280178, Japanese Patent O.P.I. Publication No. 2001-181616, Japanese Patent O.P.I. Publication No. 2002-280179, Japanese Patent O.P.I. Publication No. 2001-181617, Japanese Patent O.P.I. Publication No. 2002-280180, Japanese Patent O.P.I. Publication No. 2001-247859, Japanese Patent O.P.I. Publication No. 2002-299060, Japanese Patent O.P.I. Publication No. 2001-313178, Japanese Patent O.P.I. Publication No. 2002-302671, Japanese Patent O.P.I. Publication No. 2001-345183, Japanese Patent O.P.I. Publication No. 2002-324679, WO 02/15645, Japanese Patent O.P.I. Publication No. 2002-332291, Japanese Patent O.P.I. Publication No. 2002-50484, Japanese Patent O.P.I. Publication No. 2002-322292, Japanese Patent O.P.I. Publication No. 2002-83684, Japanese Patent O.P.I. Publication No. 2002-540572, Japanese Patent O.P.I. Publication No. 2002-117978, Japanese Patent O.P.I. Publication No. 2002-338588, Japanese Patent O.P.I. Publication No. 2002-170684, Japanese Patent O.P.I. Publication No. 2002-352960, WO 01/93642, Japanese Patent O.P.I. Publication No. 2002-50483, Japanese Patent O.P.I. Publication No. 2002-100476, Japanese Patent O.P.I. Publication No. 2002-173674, Japanese Patent O.P.I. Publication No. 2002-359082, Japanese Patent O.P.I. Publication No. 2002-175884, Japanese Patent O.P.I. Publication No. 2002-363552, Japanese Patent O.P.I. Publication No. 2002-184582, Japanese Patent O.P.I. Publication No. 2003-7469, Japanese Patent O.P.I. Publication No. 2002-525808, Japanese Patent O.P.I. Publication No. 2003-7471, Japanese Patent O.P.I. Publication No. 2002-525833, Japanese Patent O.P.I. Publication No. 2003-31366, Japanese Patent O.P.I. Publication No. 2002-226495, Japanese Patent O.P.I. Publication No. 2002-234894, Japanese Patent O.P.I. Publication No. 2002-235076, Japanese Patent O.P.I. Publication No. 2002-241751, Japanese Patent O.P.I. Publication No. 2001-319779, Japanese Patent O.P.I. Publication No. 2001-319780, Japanese Patent O.P.I. Publication No. 2002-62824, Japanese Patent O.P.I. Publication No. 2002-100474, Japanese Patent O.P.I. Publication No. 2002-203679, Japanese Patent O.P.I. Publication No. 2002-343572, and Japanese Patent O.P.I. Publication No. 2002-203678.

{Host Compound (Referred to also as Light-Emitting Host)}

The host compound used in the present invention will be described below.

The host compound is defined as a compound having a phosphorescent light quantum yield of phosphorescent light emission of less than 0.1 at room temperature (25° C.). Preferable is a compound having a phosphorescent light quantum yield of phosphorescent light emission of less than 0.01. Further, the weight ratio of the host compound in the compound contained in the light emission layer is preferably 20% or more.

As the host compound, commonly known host compounds may be used singly, or a plurality of the compounds may be used in combination. By using a plurality of host compounds, charge transfer can be controlled, whereby high efficiency of the organic EL element can be obtained. Further, different kinds of light emission are possible to be mixed by using plural kinds of the after-mentioned light-emitting dopants, whereby any light emission color can be obtained.

Further, a light-emitting host employed in the present invention may be a low molecular weight compound; may be a polymeric compound having a repeating unit; or may be a low molecular weight compound having a polymerizing group such as a vinyl group and an epoxy group (an evaporation polymerizing light-emitting host).

A commonly known host compound used in combination is preferably a compound having hole transport ability and electron transport ability; preventing longer wavelength of light emission; and having a high Tg (a glass transition temperature).

As specific examples of commonly known host compounds, listed are compounds described in the following patent documents Japanese Patent O.P.I. Publication No. 2001-257076, Japanese Patent O.P.I. Publication No. 2002-308855, Japanese Patent O.P.I. Publication No. 2001-313179, Japanese Patent O.P.I. Publication No. 2002-319491, Japanese Patent O.P.I. Publication No. 2001-357977, Japanese Patent O.P.I. Publication No. 2002-334786, Japanese Patent O.P.I. Publication No. 2002-8860, Japanese Patent O.P.I. Publication No. 2002-334787, Japanese Patent O.P.I. Publication No. 2002-15871, Japanese Patent O.P.I. Publication No. 2002-334788, Japanese Patent O.P.I. Publication No. 2002-43056, Japanese Patent O.P.I. Publication No. 2002-334789, Japanese Patent Q.P.I. Publication No. 2002-75645, Japanese Patent O.P.I. Publication No. 2002-338579, Japanese Patent O.P.I. Publication No. 2002-105445, Japanese Patent O.P.I. Publication No. 2002-343568, Japanese Patent O.P.I. Publication No. 2002-141173, Japanese Patent O.P.I. Publication No. 2002-352957, Japanese Patent O.P.I. Publication No. 2002-203683, Japanese Patent O.P.I. Publication No. 2002-363227, Japanese Patent Q.P.I. Publication No. 2002-231453, Japanese Patent O.P.I. Publication No. 2003-3165, Japanese Patent O.P.I. Publication No. 2002-234888, Japanese Patent O.P.I. Publication. No. 2003-27048, Japanese Patent O.P.I. Publication No. 2002-255934, Japanese Patent O.P.I. Publication No. 2002-260861, Japanese Patent O.P.I. Publication No. 2002-280183, Japanese Patent O.P.I. Publication No. 2002-299060, Japanese Patent O.P.I. Publication No. 2002-302516, Japanese Patent O.P.I. Publication No. 2002-305083, Japanese Patent O.P.I. Publication No. 2002-305084, Japanese Patent O.P.I. Publication No. 2002-308837 and so forth.

<<Hole Transport Layer>>

The hole transport layer is comprised of a hole transport material having ability of transporting holes, and a hole injection layer and an electron blocking layer are included in the hole transport layer in a broad sense. The hole transport layer may be provided as a single layer or plural layers.

A hole transport material is not specifically limited, and can be arbitrarily selected from those having been generally utilized as a charge injection transporting material for a hole conventionally in a photoconductive material and those commonly known which are utilized for a hole injection layer and a hole transport layer in an EL element.

The hole transport material has hole injecting ability, hole transporting ability or ability to form a barrier to electrons, and may be either an organic substance or an inorganic substance. Examples thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and a conductive oligomer, particularly a thiophene oligomer.

As the hole transport material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylarninophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)-phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylarnino]-triphenylamine (MTDATA) in which three triphenylamine units are bonded in a starburst form.

A polymeric material in which the material mentioned above is introduced into the polymer chain or a polymer having the material as the polymer main chain can also be used.

As the hole injection material or the hole transport material, inorganic compounds such as p-type-Si and p-type-SiC are usable. Further, the hole transport material is preferably one exhibiting high Tg.

This hole transport layer can be formed by layering the above-described hole transport material by a commonly known method such as a vacuum evaporation method, a spin coating method, a cast method, an inkjet method or an LB method. The thickness of the hole transport layer is not specifically limited, but is conventionally about 5-5000 nm. The hole transport layer may be composed of a single layer structure comprising one kind or at lest two kinds of the materials mentioned above.

A positive hole transport layer having a high p-type property doped with impurity can be utilized. Examples thereof include those described in Japanese Patent O.P.I. Publication No. 4-297076, Japanese Patent O.P.I. Publication No 2000-196140 and Japanese Patent O.P.I. Publication No 2001-102175, J. Appl. Phys., 95, 5773 (2004) and so forth.

<<Electron Transport Layer>>

The electron transport layer comprises a material (electron transport material) having electron transport ability, and in a broad sense refers to an electron injection layer or a hole blocking layer. The electron transport layer can be provided as a single layer or plural layers.

Conventionally, the following materials are known as the electron transport material (serving also as a hole blocking material) used in the electron transport layer close to the cathode side with respect to a light emission layer in the case of a single electron transport layer or plural electron transport layers. Further, the electron transport layer may have a function of incorporating electrons injected from a cathode to a light emission layer, and as a material thereof, any material can be selected from commonly known compounds, and be utilized.

Examples of the material used in this electron transport layer (hereinafter, referred to as an electron transport material) include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative.

Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transport material.

A polymeric material in which the material mentioned above is introduced into the polymer chain, or a polymeric material having the material as the polymer main chain can also be used.

Further, a metal complex of an 8-quinolynol derivative such as aluminum tris-(8-quinolynol) (Alq$_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) (Znq$_2$), and a metal complex formed by replacing the central metal of the foregoing complexes with another metal atom such as In, Mg, Cu, Ca, Sn, Ga or Pb, can be used as the electron transport material.

Furthermore, a metal-free or metal-containing phthalocyanine, and a derivative thereof, in which the molecular terminal is replaced by a substituent such as an alkyl group or a sulfonic acid group, are also preferably used as the electron transport material. The distyrylpyrazine derivative exemplified as a material for the light emission layer may preferably be employed as the electron transport material. An inorganic semiconductor such as n-type-Si and n-type-SiC may also be used as the electron transport material in the same manner as in the hole injection layer or in the hole transport layer.

This electron transport layer can be formed by layering the above-described electron transport material by a commonly known method such as a vacuum evaporation method, a spin coating method, a cast method, an inkjet method or an LB method. The thickness of the electron transport layer is not specifically limited, but is conventionally about 5-5000 nm, and preferably 5-200 nm. This electron transport layer may be composed of a single layer comprising at least one kind of the above-described materials.

An electron transport layer having a high n property doped with impurity can be utilized. Examples thereof include those described in Japanese Patent O.P.I. Publication No. 4-297076, Japanese Patent O.P.I. Publication No. 2000-196140, Japanese Patent O.P.I. Publication No. 2001-102175, and J. Appl. Phys., 95, 5773 (2004).

<<Reactive Organic Compound>>

In the present invention, an organic compound having a reactive group (a reactive organic compound) may be used. There is no restriction in particular as a layer in which a reactive organic compound is used, and is usable as each layer.

A network polymer having an organic molecule can be formed by reacting a reactive organic compound on a substrate. Deterioration of the element can be inhibited by adjusting a Tg (glass transition point) of a layer of structure via formation of a network polymer, Further, it is possible to change the light emission wavelength of an organic EL element or to inhibit deterioration of a specific wavelength by adjusting reaction which yields cutting or formation of the conjugated system of a molecule employing an active radical used in the element.

On the other hand, concerning production, for example, it is preferable that a lower layer is not dissolved by a coating solution of an upper layer, and it is possible to coat the upper layer by making the lower layer to resinify to reduce solvent-solubility.

One example of reactive groups usable in the present invention is shown.

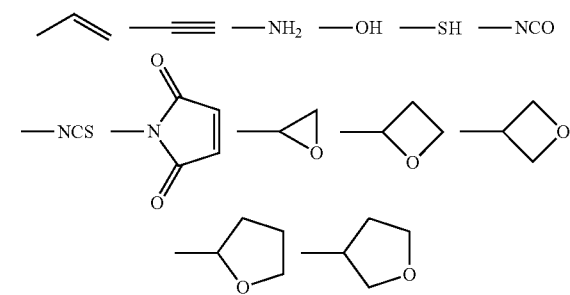

Next, one example of reactive organic compounds used in the present invention is shown, but the present invention is not limited thereto.

4-1
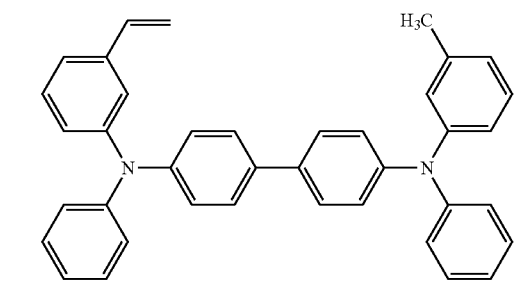
4-2
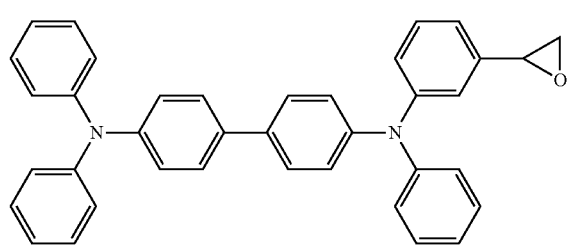
4-3
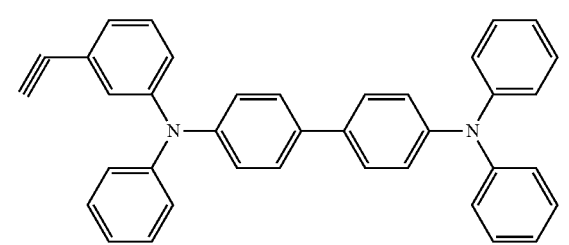
4-4
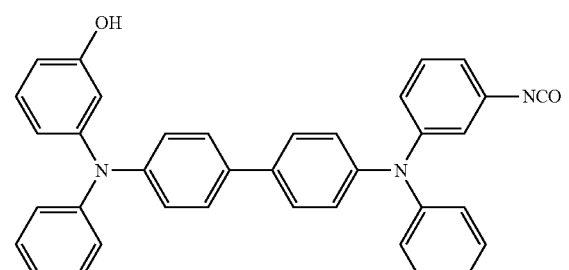
4-5
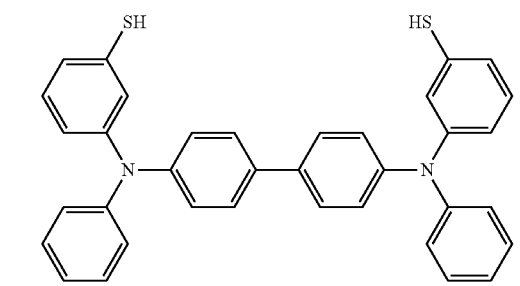
4-6
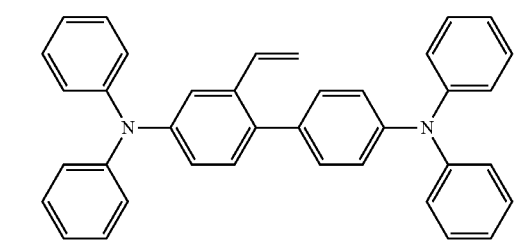
-continued
4-7
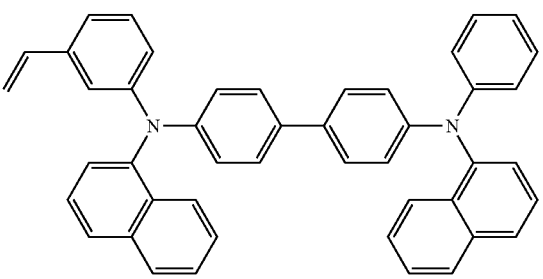
4-8
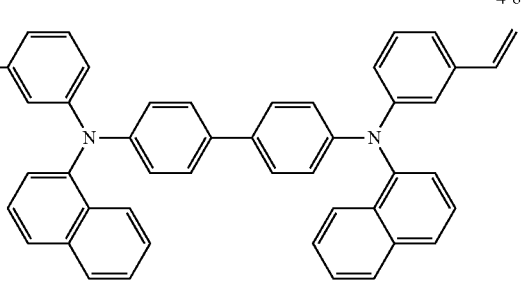
4-9
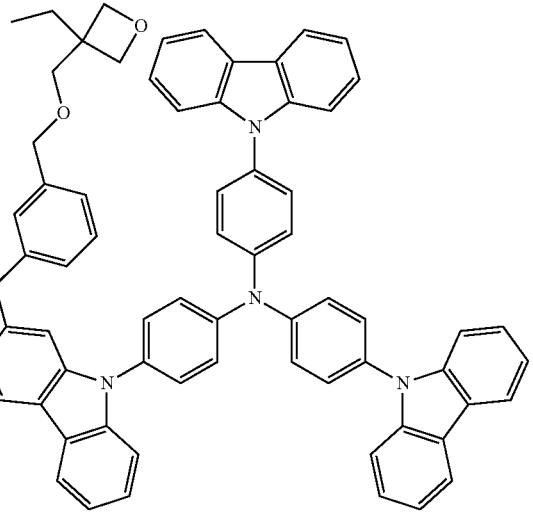
4-10
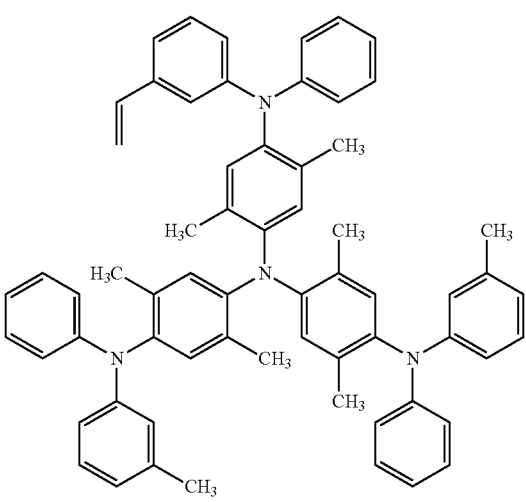

<<Anode>>

For an anode of an organic EL element in the present invention, a metal, an alloy, or a conductive compound each having a high working function (4 eV or more), and mixture thereof are preferably used as the electrode material. Specific examples of such an electrode material include a metal such as Au, and a transparent conductive material such as CuI, indium tin oxide (ITO), $SnO_2$ or ZnO. Further, a material such as IDIXO ($In_2O_3$—ZnO) capable of forming an amorphous and transparent conductive layer may be used.

The anode may be prepared by forming a thin layer of the electrode material according to a evaporation or sputtering method, and by forming the layer into a desired pattern according to a photolithographic method. When precision of the pattern is not desired to be not so high (roughly 100 μm or more), the pattern may be formed via evaporation or sputtering of the electrode material through a mask having a desired form. When light emission is taken out from this anode, transmittance is preferably larger than 10%, and the anode preferably has a sheet resistance of not more than several hundreds of Ω/□. Further, the thickness depends on material, but conventionally, a thickness of 10 nm-1000 nm is selected, and a thickness of 10 nm-200 nm is preferably selected.

<<Cathode>>

On the other hand, for the cathode, a metal (referred to also as an electron injecting metal), an alloy and a conductive compound each having a low working function (4 eV or less), and a mixture thereof is used as the electrode material. Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare-earth metal.

Among them, a mixture of an electron injecting metal and a metal higher in the working function than that of the electron injecting metal, such as a magnesium/silver mixture, a magnesium/aluminum mixture, a magnesium/indium mixture, an aluminum/aluminum oxide ($Al_2O_3$) mixture, a lithium/aluminum mixture, or aluminum is suitable in view of durability against electron injection and oxidation.

The cathode can be prepared by forming a thin layer of such an electrode material by a method such as a deposition or sputtering method. The sheet resistance as the cathode is preferably not more than several hundreds of Ω/□, and conventionally, a thickness of 10 nm-1000 nm is selected and a thickness of 50 nm-200 nm is preferably selected.

It is preferred in enhancing emission luminance that either the anode or the cathode of the organic EL element is transparent or semi-transparent, in order to make light emission to pass through.

<<Supporting Substrate (Referred to also as a Substrate, a Base Material or a Support)>>

The supporting substrate employed for the organic EL element of the present invention is not specifically limited to kinds of materials such as glass and plastic, and further, the supporting substrate is not limited as long as it is transparent, but preferable examples of the usable substrate include a substrate made of glass or quartz and a transparent resin film. Specifically preferred supporting substrate is a resin film capable of providing flexibility to the organic EL element.

Examples of the resin film include films made of polyethylene terephthalate (PET), polyethylene naphthalate (PEN), polyethersulfone (PET), polyetherimide, polyetherether ketone, polyphenylenesulfide, polyarylate, polyimide, polycarbonate (PC), cellulose triacetate (TAC), cellulose acetate propionate (CAP) and so forth.

On the surface of the resin film, an inorganic or organic cover film or a hybrid cover film comprising the both may be formed, and the foregoing cover film is preferably a high barrier film having a water vapor permeability of 0.01 $g/m^2 \cdot day$ or less.

The externally taking-out efficiency of light emission of an organic electroluminescent element of the present invention at room temperature is preferably 1% or more, and more preferably 5% or more. Herein, externally taking-out quantum efficiency (%)=(the number of photons emitted to the exterior of the organic electroluminescent element×100)/(the number of electrons supplied to the organic electroluminescent element)

When the element is used for illumination, a film having been subjected to surface-roughening to reduce light emission unevenness (such as an anti-glare film or the like) can be used in combination.

<<Sealing>>

As the sealing means used in the present invention, there is a method in which adhesion of a sealing member to an electrode and a supporting substrate is carried out employing an adhesive agent. The sealing member is formed so as to cover the displaying region of an organic EL element and may have a flat plate shape or a concave plate shape, and transparency and an electrical insulation property thereof are not specifically limited.

Specific examples of the sealing member include a glass plate, a polymer plate, a polymer film, a metal plate and a metal film. As the glass plate, a plate of soda-lime glass, barium strontium-containing glass, lead glass, aluminosilicate glass, boron silicate glass, barium boron silicate glass or quartz is usable.

As the polymer plate, a plate of polycarbonate, acryl resin, polyethylene terephthalate, polyether sulfide or polysulfone is usable. As the metal plate, a plate composed of at least one metal selected from the group consisting of stainless steel, iron, copper, aluminum, magnesium, nickel, zinc, chromium, titanium, molybdenum, silicon, germanium and tantalum, or an alloy thereof is provided. In the present invention, the polymer film and the metal film are preferably used since the element formed from a thinner film can be prepared.

Further, the polymer film is preferably one having an oxygen permeability of $10^{-3}$ $ml/m^2 \cdot 24$ hr·MPa or less, and a water vapor permeability (at 25° C. and 90% RH) of $10^{-5} g/m^2 \cdot 24$ hr or less. For processing the sealing material in the form of the concave, a sandblast treatment and a chemical etching treatment are used.

As the adhesive agent, there are mentioned a photo-curable or thermo-curable adhesive agent containing a reactive vinyl group such as an acrylic acid based oligomer or a methacrylic acid based oligomer, and a moisture curable adhesive agent such as 2-cyanoacrylate or the like.

Further, examples of the adhesive agent include an epoxy based thermally and chemically (two liquid type) curable adhesive agents, and a hot-melt type polyimide, polyester or polyolefin adhesive agents.

Further, a cationic curable type UV-curable epoxy resin adhesive can be provided. In addition, the organic EL element is degraded by a heat treatment in some cases, and therefore, an adhesive agent capable of being cured within the temperature range of from room temperature to 80° C. is preferred. A drying agent may be dispersed in the adhesive agent. Coating of the adhesive agent onto the adhering portion may be performed by a dispenser available on the market or by printing such as screen printing.

It is preferred that a layer made of an inorganic or organic material is formed as a sealing layer on an electrode placed on the side facing a supporting substrate, and an organic layer is provided between the substrate and the electrode, so as to cover the electrode and the organic layer and contact with the substrate. In such a case, a material to form the sealing layer may be a material having a function to inhibit permeation substances such as water and oxygen causing degradation of the element, and for example, silicon oxide, silicon dioxide and silicon nitride are usable. The sealing layer preferably has a multi-layered structure composed of a layer made of an inorganic material and a layer made of an organic material to improve fragility of the layer.

<<Protective Layer and Protective Plate>>

A protective layer or a protective plate may be provided on the foregoing sealing layer formed on the side facing the substrate through the organic layer or outside the sealing layer in order to raise mechanical strength of the element. Specifically when sealing is carried out by the sealing layer as described above, such a protective layer or plate is preferably provided, since strength of the element is not so high. As materials for the protective layer or plate, the same glass plate, polymer plate, polymer film, metal plate and metal film as those described above to be used for sealing are usable. The polymer film is preferably used from the viewpoint of light weight and a thin layer formation property.

<<Taking-Out of Light>>

It is generally said that, in the organic EL element, light is emitted in a layer whose refractive index (the refractive index is about 1.7-2.1) is higher than that of air, and only 15 to 20% of light emitted in the light emission layer can be taken out. This is because light which enters a boundary (a boundary between a transparent substrate and the atmosphere) at an angle θ larger than a critical angle is totally reflected and cannot be taken out from the element, or because light is totally reflected at a boundary between the transparent substrate and the transparent electrode or between the transparent substrate and the light emission layer, so that the light exits from the side of the element through the transparent electrode or the light emission layer.

As methods to improve the light taking-out efficiency, there are a method to form concavity and convexity on the surface of the transparent substrate to prevent total internal reflection at a boundary between the transparent substrate and atmospheric air (see U.S. Pat. No. 4,774,435); a method to provide light focusing properties to the substrate to improve the efficiency (see Japanese Patent O.P.I. Publication No. 63-314795); a method to form a reflection surface on the side of the element (see Japanese Patent O.P.I. Publication No. 1-220394); a method to form a flat layer having an intermediate refractive index between the substrate and the light emission layer to form an anti-reflection layer (see Japanese Patent O.P.I. Publication No. 62-172691); a method to form a flat layer having a low refractive index between the substrate and the light emission layer (see Japanese Patent O.P.I. Publication No. 2001-202827); and a method to form a diffraction lattice at a boundary between any two of the substrate, the transparent electrode and the light emission layer (including a boundary between the substrate and atmospheric air) (see Japanese Patent O.P.I. Publication No. 11-283751).

In the present invention, these methods can be used in combination with the organic EL element of the present invention. Also, a method of forming a flat layer having a lower refractive index than that of the substrate between the substrate and the light emission layer, or a method of forming a diffraction lattice at a boundary between any of the substrate, transparent electrode and light emission layer (including a boundary between the substrate and the atmosphere) can be preferably used.

In the present invention, an organic EL element exhibiting further higher luminance and durability can be obtained by using these methods in combination.

When a low refractive index medium with a thickness greater than light wavelength is formed between a transparent electrode and a transparent substrate, the taking-out efficiency of light, which comes out of the transparent electrode, increases, as the refractive index of the medium decreases.

As a low refractive index layer, aerogel, porous silica, magnesium fluoride and a fluorine-containing polymer are cited, for example. Since refractive index of the transparent substrate is conventionally 1.5-1.7, the refractive index of the low refractive index layer is preferably 1.5 or less and more preferably 1.35 or less.

The thickness of a low refractive index medium is preferably twice or more of the wavelength of light in the medium, because when thickness of the low refractive index medium is such that the electromagnetic wave exuding as an evanescent wave enters the transparent substrate, the effect of the low refractive index layer is reduced.

A method to provide a diffraction lattice at a boundary where the total internal reflection occurs or in some of the media has a feature that the effect of enhancing the light taking-out efficiency increases.

The intension of this method is to provide a diffraction lattice at a boundary between any of the layers or in any of the mediums (in the transparent substrate or in the transparent electrode) and extract light which cannot exit due to total reflection occurring at a boundary between the layers among lights emitted in the light emission layer, which uses the property of the diffraction lattice that can change the direction of light to a specific direction different from the direction of reflection due to so-called Bragg diffraction such as primary diffraction or secondary diffraction.

It is preferred that the diffraction lattice to be provided has a two-dimensional periodic refractive index. This is because, since light generated in the light emission layer is emitted randomly in all the directions, only the light proceeding in a specific direction can be diffracted when a general one-dimensional diffraction lattice having a periodic refractive index distribution only in a specific direction is used, which does not greatly increase the light taking-out efficiency.

However, a refractive index distribution is two-dimensionally distributed, whereby the light proceeding in all the directions can be diffracted, and then the light taking-out efficiency is increased.

The position where the diffraction lattice is introduced, as previously described, is any of boundaries each between layers or in a medium (in the transparent substrate or in the transparent electrode), but it is preferably provided in the vicinity of the organic light emission layer where the light is emitted.

In this case, the period of the diffraction lattice is preferably about ½ to 3 times the wavelength of light in the medium.

The array of the diffraction lattice is preferably two-dimensionally repeated as in the shape of a square lattice, a triangular lattice, or a honeycomb lattice.

<<Light Collection Sheet>>

In the organic EL element of the present invention, luminance in a specified direction can be increased, for example, by providing a structure in the four' of a micro-lens array on the light taking-out side surface of the substrate or in combination with a so-called light collection sheet, whereby light is focused in a specific direction, for example, in the front direction to the light-emitting plane of the element.

As an example of a micro-lens array, there is one in which quadrangular pyramids having a side of 30 μm and having a vertex angle of 90° are two-dimensionally arranged on the light taking-out side surface of the substrate. The side of the quadrangular pyramids is preferably 10-100 μm.

When the length of the side is shorter than the above range, the light is colored via producing of the effect of diffraction, while when it is longer than the above range, it becomes unfavorably thick.

As the light collection sheet, one practically applied for an LED backlight of a liquid crystal display is applicable. Usable examples of such a sheet include a brightness enhancing film (BEE) produced by SUMITOMO 3M Inc.

As shape of a prism sheet, there may be included one in which a triangle-shaped strip having a vertex angle of 90° and a pitch of 50 μm provided on a substrate, one having round apexes, one having a randomly changed pitch or other ones.

In order to control an emission angle of light emitted from the light-emitting element, a light diffusion plate or film may be used in combination with the light collection sheet. For example, a diffusion film (Light-Up, produced by KIMOTO Co., Ltd.) is usable.

<<Application>>

The organic EL element of the present invention can be used for a display device, a display, or various light emission sources. Examples of the light emission sources include an illuminating device (a home lamp or a room lamp in a car), a backlight for a watch or a liquid crystal, a light source for boarding advertisement, a signal device, a light source for a photo memory medium, a light source for an electrophotographic copier, a light source for an optical communication instrument, and a light source for an optical sensor, but the present invention is not limited thereto. Specifically, it is effectively usable as a backlight for a liquid crystal or a light source for illumination.

Further, in the case of an organic EL element of the present invention, patterning may be carried out with a metal mask or by an inkjet printing method, if desired. The patterning may be carried out only in electrodes, in both electrodes and light emission layers, or in all the layers of the element. Further, the element can also be prepared according to a commonly known method.

Figure 4:
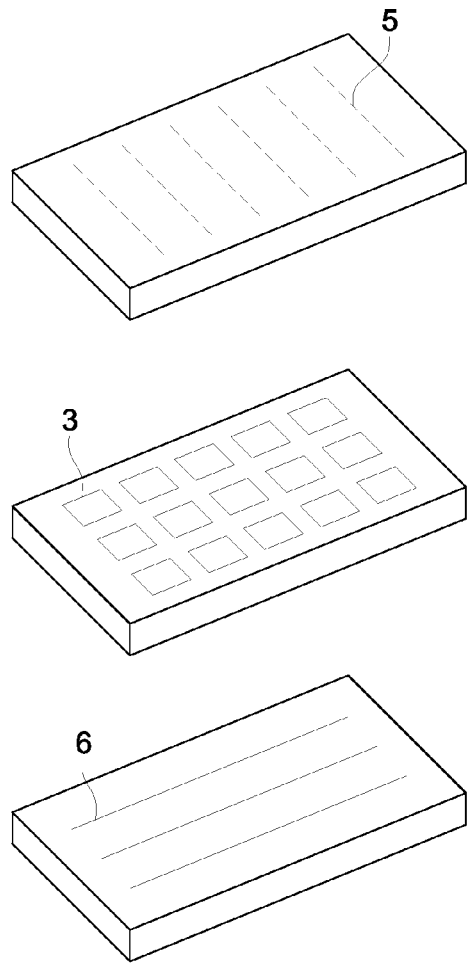
FIG. 4 is a schematic diagram showing a display device in a passive matrix system.

Color of light emitted from the organic EL element of the present invention or from the compounds in the present invention is specified with color obtained when measurements determined by a spectral radiance luminance meter CS-1000 (produced by Konica Minolta Sensing Co., Ltd.) are applied to the CIE chromaticity coordinates in 16 of FIG. 4 on page 108 of "Shinpen Shildsai Kagaku Handbook (edited by The Color Science Association of Japan, University of Tokyo Press, 1985).

When the organic EL element of the present invention is a white light element, "white" means that when front luminance of a 2° viewing angle is determined via the above method, color temperature at 1,000 Cd/m² is in the range of 2500-6500 K (deviation from a black body Δuv=±0.03).

<<Display Device>>

A display device of the present invention will be described. The display device of the present invention is one fitted with an organic EL element of the present invention.

A display device of this invention may be either monochromatic or multi-colored, but herein a multicolor display device will be described. In the case of a multicolor display device, a shadow mask is provided only during formation of a light emission layer, and layers can be formed on the entire surface by a method such as an evaporation method, a cast method, a spin coating method, an inkjet method or a printing method.

When only an emission layer is subjected to patterning, a method thereof is not specifically limited, but preferable are an evaporation method, an inkjet method, a spin coaling method and a printing method.

A structure of an organic EL element installed in a display device is selected from constituent examples of the above described organic EL elements, if desired.

Further, a method of manufacturing an organic EL element is as indicated in an embodiment in which the above-described organic EL element of the present invention is manufactured.

When a direct current voltage is applied to the resulting multicolor display device, light emission can be observed via application of a voltage of approximately 2-40 V setting an anode to + (plus) polarity and a cathode to − (minus) polarity. Further, no current flows, whereby no light emission is produced at all even though a voltage is applied with a reversed polarity. Further, in the case of application of alternate current voltage, light emission is produced only in a state of an anode being + (plus) polarity and a cathode being − (minus) polarity. In addition, the waveform of alternate current may be arbitrary.

A multicolor display device can be utilized as a display device, a display or various types of light emission sources. In a display device and a display, full-colored display becomes possible by employing three types of organic EL elements providing blue, red and green light emissions.

A display device and a display include a TV, a personal computer, a mobile instrument, an AV instrument, a character broadcast display and an information display in a car. Specicically, the display device and the display may be also utilized as a display to playback still images and moving images, and may adapt either a simple matrix (a passive matrix) system or an active matrix system when being utilized as a display device for moving image playback.

Examples of light emission sources include a home use illumination, a car room illumination, a backlight of a watch or a liquid crystal, a panel advertisement, a signal, a Fight source of an optical memory medium, a light source for an electrophotographic copier, a light source for an optical telecommunication processor and a light source for a photosensor, but the present invention is not limited thereto.

Next, one example of a display device possessing an organic EL element of the present invention will be described, referring to drawings.

FIG. 1 is a diagram showing an example of a display device possessing an organic EL element. It is a diagram of a display such as a mobile phone, which displays image information via light emission of the organic EL element.

Display 1 is composed of display section A having plural pixels and control section B to conduct image scanning of display section A based on image information.

Control section B is electrically connected to display section A; a scanning signal and an image data signal are sent to each of plural pixels based on image information from the outside; and pixels of each scanning line successively emit light in accordance with the image data signal by a scanning signal to perform image scanning, whereby image information is displayed on display section A.

Figure 2:
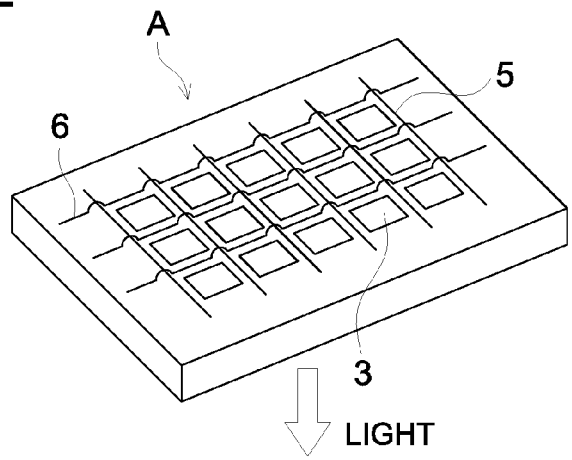
FIG. 2 is a schematic diagram showing another example of
FIG. 3 is a schematic diagram showing a pixel.

FIG. 2 shows a diagram of display section A.

Display section A possesses a wiring part containing plural scanning lines 5 and data lines 6, and plural pixels 3 provided on a substrate. Main members in display section A will be described below.

In the figure, shown is the case where light emitted by pixel 3 is taken out in the white arrow direction.

Scanning lines 5 and plural data lines 6 in a wiring part each are made of a conductive material, and scanning lines 5 are perpendicular to data lines 6 in the form of a grid, and pixels 3 is connected at the orthogonally crossing position (details are not shown in the drawing).

When a scanning signal is applied from scanning line 5, an image data signal is received from data lines 6, and pixel 3 emits light in accordance with the received image data.

Full-color display becomes possible by placing pixels in a red region, pixels in a green region and pixels in a blue region as light emission color, side by side appropriately on the same substrate.

Next, light emission process of pixels will be described.

Figure 3:
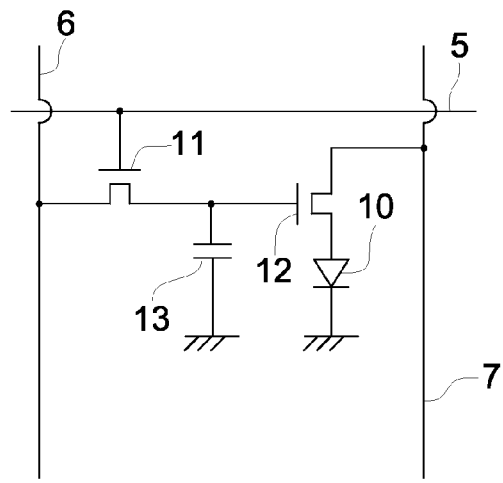

FIG. 3 is a schematic diagram showing a pixel.

A pixel is equipped with organic EL element 10, switching transistor 11, driving transistor 12, condenser 13 and so forth. Red, green and blue emitting organic EL elements are employed as organic EL element 10 for plural pixels, and full-color display can be conducted by placing these side by side on the same substrate.

In FIG. 3, an image data signal is applied to a drain of switching transistor 11 via data line 6 from control section B. Then, when a scanning signal is applied to a gate of switching transistor 11 via scanning line 5 from control section B, driving of switching transistor is turned on to transmit the image data signal applied to the drain to the gates of condenser 13 and driving transistor 12.

Condenser 13 is charged in response to a potential of an image data signal via transmission of the image data signal, and driving of transistor 12 is simultaneously turned on. In driving transistor 12, the drain is connected to power supply line 7, and the source is connected to an electrode of organic EL element 10 to supply electric current from power supply line 7 to organic EL element 10 in accordance with a potential of the image data applied to the gate.

When a scanning signal is transferred to next scanning line 5 by sequentially scanning control section B, driving of switching transistor 11 is turned off. However, since condenser 13 keeps the charged potential of the image data signal even though driving of switching transistor 11 is turned off, driving of driving transistor 12 keeps on turning on, and light emission of organic EL element 10 continues until the next scanning signal is applied. When the next scanning signal is applied by sequential scanning, driving transistor 12 is driven in response to a potential of the next image data signal synchronized to the scanning signal, whereby organic EL element 10 emits light.

That is, as to light emission of organic EL element 10, switching transistor 11 and driving transistor 12 as active elements are provided with respect to organic EL element 10 of each of plural pixels, whereby light emission of organic EL element 10 of each of plural pixels 3 is made. Such a light emission method is called an active matrix system.

Herein, light emission of organic EL element 10 may be light emission of plural gradations based on multiple-valued image data signals having plural gradation potentials, or may be on-off of a predetermined light emission quantity based on binary-valued image data signals. Further, the potential of condenser 13 may be continuously maintained until the next scanning signal is applied, or may be discharged immediately before the next scanning signal is applied.

In the present invention, light emission driving in a passive matrix system in which an organic EL element is emitted in response to a data signal only when a scanning signal is scanned may be used in addition to the above-described active matrix system.

FIG. 4 is a schematic diagram showing a display device in a passive matrix system. In FIG. 4, pixels 3 is sandwiched between plural scanning lines 5 and plural image data lines 6 which are facing to each other in the lattice form.

When a scanning signal of scanning lines 5 is applied via sequential scanning, pixel 3 connected to scanning lines 5 having been applied emits light in response to the image data signal.

In the case of a passive matrix system, an active element is not utilized for pixel 3, resulting in reduction of manufacturing cost.

<<Illuminating Device>>

An illuminating device of the present invention will be described. The illuminating device of the present invention possesses the above-described organic EL element.

The organic EL element of the present invention may be employed as one having a resonator structure. As intended use of the aforesaid organic EL element having such a resonator structure include, provided are a light source for an optical memory medium, a light source for an electrophotographic copier, a light source for an optical communication processor, and a light source for an optical sensor, but the present invention is not limited thereto. Further, laser oscillation may also be applied for the above-described intended use.

Further, the organic EL element of the present invention may also be employed as a type of lamp for lighting or an exposure light source, a projection device to project images, and a display device (display) to directly visualize still images and moving images.

A drive system employed as a display for reproduction of moving images may be allowed to be a simple matrix (passive matrix) system, and also allowed to be an active matrix system. Alternatively, it is possible to prepare a full-color display device by using at least two types of the organic EL elements of the present invention having different light emission colors, Further, the organic EL materials of the present invention can be applied to an organic EL element which substantially emits white light as an illuminating device. White light emission is obtained through mixed color produced from simultaneous emission of plural colors by plural light-emitting materials. Concerning combinations of light emission colors, three light-emitting maximum wavelengths of the three primary colors of blue, green and red may be included, or two light-emitting maximum wavelengths utilizing the complementary color relationship such as blue and yellow or bluish-green and orange may also be included.

Further, concerning combinations of light-emitting materials to obtain plural light emission colors, any of one in which plural light-emitting materials emitting phosphorescence or fluorescence are used in combination and one in which a light-emitting material emitting fluorescence or phosphorescence and a dye material emitting light as excited light from a light-emitting material are used in combination may be allowed to be used, but in the case of a white organic EL element of the present invention, it is sufficient that plural light-emitting dopants are only used in combination.

It is sufficient that a mask is provided only during formation of a light emission layer, a hole transport layer, an electron transport layer or the like, and a simple arrangement such as coating separation produced by the mask may only be provided. Since other layers are common layers, no patterning such as a mask is carried out, and an electrode film, for example, can be formed on one surface by a vacuum evaporation method, a cast method, a spin coating method an inkjet method, or a printing method, resulting in improvement of productivity.

In accordance with this method, the element itself emits white light, differing from a white organic EL device in which light-emitting elements emitting plural colors are paralleled to form an array.

Materials used in the light emission layer are not specifically limited. For example, in regard to a backlight in a liquid crystal display element, white may be realized by selecting any of metal complexes relating to the present invention or commonly known light-emitting materials, and using them in combination so as to match a wavelength region suitable for CF (color filter) characteristics.

<<One Embodiment of Illuminating Device of Present Invention>>

One embodiment of an illuminating device of the present invention possessing an organic EL element of the present invention will now be described.

The non-light-emitting surface of the organic EL element of the present invention is covered with a glass case, and a 300 μm thick glass substrate is employed as a sealing substrate. As a sealing material, an epoxy based light curable type adhesive (LUXTRACK LC0629B, produced by Toagosei Co., Ltd.) is applied for the periphery, and the resulting product is superposed onto the cathode to be brought into close contact with a transparent supporting substrate, followed by curing by exposing the glass substrate side to UV radiation for sealing, whereby it is possible to form the illuminating devices, shown in FIGS. 5 and 6.

Figure 5:
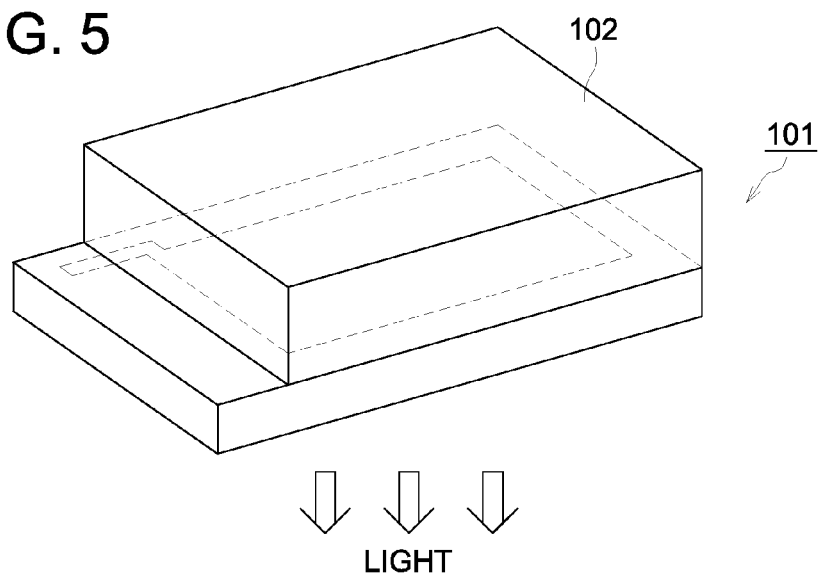
FIG. 5 is a schematic diagram showing an illuminating device.

FIG. 5 is a schematic diagram showing an illuminating device. Organic EL element 101 of the present invention is covered with glass cover 102 {incidentally, sealing via the glass cover was conducted in a glove box (under atmosphere of high purity nitrogen gas having a purity of 99.999% or more)} without having organic EL element 101 brought into contact with the ambient atmosphere).

Figure 6:
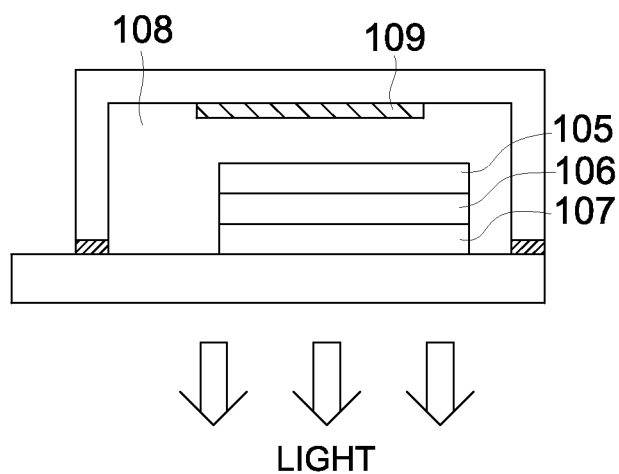
FIG. 6 shows a general illustration of an illuminating device.

FIG. 6 shows a cross-sectional view of the illuminating device. In FIG. 6, numeral 105 represents a cathode, numeral 106 represents an organic EL layer, and numeral 107 represents a glass substrate fitted with a transparent electrode. In addition, inside of glass cover 102, nitrogen gas 108 is filled, and water catching agent 109 is provided.

EXAMPLE

Next, the present invention will be specifically described referring to examples, but the present invention is not limited thereto. Further, structural formulae of compounds used in the examples are shown below. Incidentally, "parts" and "%" in the examples represent "parts by weight" and "% by weight", respectively.

Exemplified Compounds

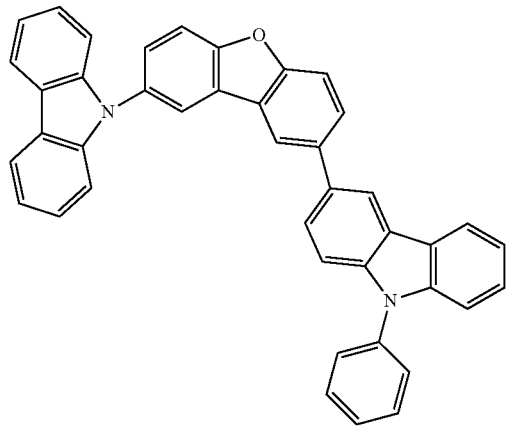

H-A

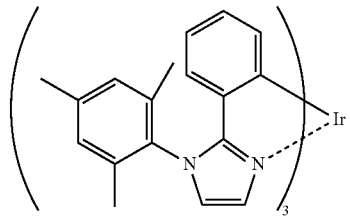

1-79

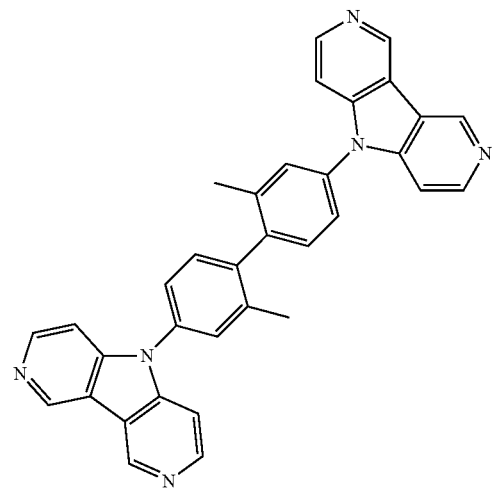

ET-A

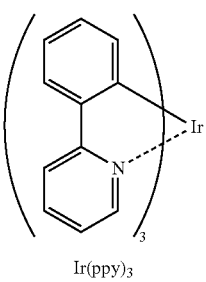

Ir(ppy)$_3$

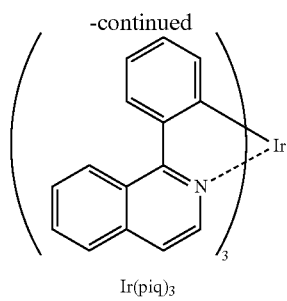

Ir(piq)₃

Example 1

<<Preparation of Organic EL Element 101>>

A substrate (NA45, produced by NH Techno Glass Corp.), prepared by forming a 100 nm thick ITO (indium tin oxide) film on a glass plate having a size of 100 min×100 mm×1.1 mm as an anode, was subjected to patterning, and a substrate provided with this ITO transparent electrode was cleaned with isopropyl alcohol via ultrasonic waves, followed by being dried employing dry nitrogen gas and being cleaned for 5 minutes employing UV ozone.

After a solution in which poly(3,4-ethylenedioxythiophene)-polystyrene sulfonate (PEDOT/PSS, produced by H. C. Starlk Co., Ltd., Baytron P AI 4083) was diluted with pure water by 70% was coated on this substrate by a spin coating method at 3000 rpm for 30 minutes for film formation, the resulting was dried at 200° C. for one hour to form a hole injection layer having a layer thickness of 30 nm.

After moving this substrate in nitrogen atmosphere, a solution in which 50 mg of exemplified compound 4-8 were dissolved in 10 ml of toluene was coated on the hole injection layer by a spin coating method at 1500 rpm for 30 seconds to form a film having a film thickness of 20 nm, and the resulting was exposed to UV radiation for 60 seconds, followed by drying at 120° C. for 30 minutes to prepare a hole transport layer.

This substrate was fixed at a substrate holder of a vacuum evaporator, and on the other hand, H-A, exemplified compound 1-79, Ir(ppy)₃, Ir(piq)₃, ET-A and CsF were charged in 6 molybdenum resistance heating boats, respectively to set those in the vacuum evaporator.

After depressurizing the vacuum chamber to $4 \times 10^{-4}$ Pa, electricity was applied independently to each of the foregoing heating boat in which H-A was charged, the foregoing heating boat in which 1-79 was charged, the foregoing heating boat in which Ir(ppy)₃ was charged, and the foregoing heating boat in which Ir(piq)₃ was charged, and an evaporation speed of H-A as a light-emitting host, an evaporation speed of 1-79 as a light-emitting dopant, an evaporation speed of Ir(ppy)₃ and an evaporation speed of Ir(piq)₃ were adjusted to 100:10:0.2:0.2 in ratio, and evaporation was carded out so as to give a layer thickness of 40 nm to form a light emission layer.

Further, electricity is applied to the foregoing heating boat in which ET-A and CsF were charged, and heat was applied to it. They were evaporated onto the foregoing light emission layer at an evaporation speed of 0.2 nm/sec and at an evaporation speed of 0.03 nm/sec, respectively to form an electron transport layer having a layer thickness of 40 nm. Continuously, 110 nm thick aluminum was prepared via evaporation to form a cathode, whereby organic EL element 101 was prepared.

<<Preparation of Organic EL Elements 102-104>>

Each of organic EL elements 102-104 was prepared similarly to preparation of organic EL elements 101, except that the following annealing treatment (via current or heat) was carried out after preparing the element.

| Organic EL element No. | Annealing via current | Annealing via heat | Remarks |
|---|---|---|---|
| 101 | Not applied | Not applied | Comparative example |
| 102 | Applied | Not applied | Present invention |
| 103 | Not applied | Applied | Present invention |
| 104 | Applied | Applied | Present invention |

In preparation of each of organic EL elements 102-104, annealing via current means an annealing treatment in which current is applied until reaching a state in which luminance is lowered to 80% in an initial luminance of 1000 cd/m², and annealing via heat (also referred to simply as heat annealing) means an annealing treatment in which a heat treatment is carried out in a thermostatic oven at 85° C. during aging for one hour.

<<Evaporation of Organic EL Element>>

As to each of the resulting organic EL elements 101-104, externally taking-out quantum efficiency and lifetime at an initial luminance of 2000 cd/m² were evaluated as described below.

<<Externally Taking-Out Quantum Efficiency>>

Externally taking-out quantum efficiency (%) at a time when flowing a constant current of 2.5 mA/cm² to the resulting organic EL element was measured. In addition, a spectral radiance luminance meter CS-1000 (produced by Konica Minolta Sensing Co., Ltd.) was employed for the measurement.

(Evaluation of Lifetime)

Light-emitting lifetime of the resulting organic EL element was evaluated by driving each organic EL element at driving current (A) to produce an initial luminance of 2000 cd/m², and taking time necessary for reducing luminance to half of the luminance.

When organic EL element 101 was set to 100, luminance half-lifetime of each of organic EL elements 102-104 was relatively evaluated, and shown below.

| Organic EL element No. | Lifetime (referred to also as light-emitting lifetime) | Remarks |
|---|---|---|
| 101 | 100 | Comparative example |
| 102 | 130 | Present invention |
| 103 | 120 | Present invention |
| 104 | 140 | Present invention |

As is clear from the above-described, it is to be understood that organic EL elements of the present invention exhibit longer lifetime when annealing via current and annealing via heat are applied to organic EL elements.

Example 2

<<Preparation of Organic EL Element 201>>

A substrate (NA45, produced by NH Techno Glass Corp.), prepared by forming a 100 nm thick ITO (indium tin oxide) film on a glass plate having a size of 100 mm×100 mm×1.1 mm as an anode, was subjected to patterning, and a substrate provided with this ITO transparent electrode was cleaned with isopropyl alcohol via ultrasonic waves, followed by being dried employing dry nitrogen gas and being cleaned for 5 minutes employing UV ozone.

After a solution in which poly(3,4-ethylenedioxythiophene)-polystyrene sulfonate (PEDOT/PSS, produced by H. C. Starlk Co., Ltd., Baytron P AI 4083) was diluted with pure water by 70% was coated on this substrate by a spin coating method at 3000 rpm for 30 minutes for film formation, the resulting was dried at 200° C. for one hour to form a hole injection layer having a layer thickness of 30 nm.

After moving this substrate in nitrogen atmosphere, a solution in which 50 mg of exemplified compound 4-8 were dissolved in 10 ml of toluene was coated on the hole injection layer by a spin coating method at 1500 rpm for 30 seconds to form a film having a film thickness of 20 nm, and the resulting was exposed to UV radiation for 60 seconds, followed by drying at 120° C. for 30 minutes to prepare a hole transport layer.

Next, light emission layer components having the following composition were coated by a spin coating method at 2000 rpm for 30 seconds to form a film having a film thickness of 40 nm, followed by drying at 120° C. for 30 seconds to prepare a light emission layer.

| (Light emission layer components) | |
|---|---|
| Toluene | 10 ml |
| H-A | 100 mg |
| 1-79 | 10 mg |
| Ir (ppy)$_3$ | 0.2 mg |
| Ir (piq)$_3$ | 0.2 mg |

This substrate was fixed at a substrate holder of a vacuum evaporator, on the other hand, 200 mg of ET-A were charged in a molybdenum resistance heating boat, and 100 mg of CsF were charged in another molybdenum resistance heating boat to set those in the vacuum evaporator.

After depressurizing a vacuum chamber to $4 \times 10^{-4}$ Pa, electricity was applied to the foregoing heating boat in which ET-A and CsF were charged to heat the boat, and they were evaporated onto the foregoing light emission layer at an evaporation speed of 0.2 nm/sec and at an evaporation speed of 0.03 nm/sec, respectively to further form an electron transport layer having a layer thickness of 40 nm. Continuously, 110 nm thick aluminum was prepared via evaporation to form a cathode, whereby organic EL element 201 was prepared.

<<Preparation of Organic EL Elements 202-204>>

Each of organic EL elements 202-204 was prepared similarly to preparation of organic EL elements 201, except that the following annealing treatment (via current or heat) was carried out after preparing the element.

In addition, annealing via current or annealing via heat was carried out in the same way as described in Example 1.

| Organic EL element No. | Annealing via current | Annealing via heat | Lifetime | Remarks |
|---|---|---|---|---|
| 201 | Not applied | Not applied | 100 | Comparative example |
| 202 | Applied | Not applied | 120 | Present invention |
| 203 | Not applied | Applied | 120 | Present invention |
| 204 | Applied | Applied | 130 | Present invention |

As is clear from the above-described, it is to be understood that organic EL elements of the present invention exhibit longer lifetime when annealing via current and annealing via heat are applied to organic EL elements.

Further, in the other experiment, it was to be understood that an organic EL element of the present invention in which a light emission layer was prepared via a coating process exhibited excellently longer lifetime than that of another organic EL element of the present invention in which a light emission layer was prepared via evaporation.

Explanation Of Numerals
1 Display
3 Pixel
5 Scanning line
6 Data line
7 Power supply line
10 Organic EL element
11 Switching transistor
12 Driving transistor
13 Condenser
A Display section
B Control section
101 Organic EL element
102 Glass cover
105 Cathode
106 Organic EL layer
107 Glass substrate fitted with transparent electrode
108 Nitrogen gas
109 Water catching agent

The invention claimed is:

1. A method of manufacturing an organic electroluminescent element in which at least an anode, a light emission layer and a cathode are laminated,
    wherein at least one light emission layer comprises two kinds of light-emitting dopants, the method comprising the step of:
    conducting a process in which the organic electroluminescent element is subjected to an annealing treatment after forming at least the anode, the at least one light emission layer and the cathode as an element structure, and
    wherein the organic electroluminescent element is a white light-emitting organic electroluminescent element.

2. The method of claim 1, comprising the step of:
    forming the at least one light emission layer by a coating process.

3. The method of claim 1,
    wherein the at least one light emission layer comprises a host compound, and at least one of the two kinds of light-emitting dopants a compound represented by the following Formula (1):

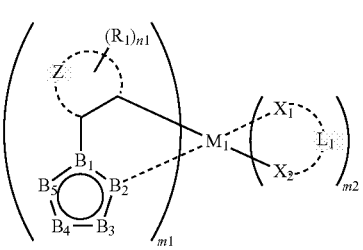

Formula (1)

where $R_1$ represents a substituent; Z represents a group of non-metal atoms to form a 5-membered ring to 7-membered ring; n1 represents an integer of 0-5; each of $B_1$-$B_5$ represents a carbon atom, a nitrogen atom, an oxygen atom or a sulfur atom; at least one of $B_1$-$B_5$ represents a nitrogen atom; $M_1$ represents a transition metal selected from groups 8-10 in the element periodic table; each of $X_1$ and $X_2$ represents a carbon atom, a nitrogen atom or an oxygen atom; $L_1$ represents a group of atoms to form a bidentate ligand together with $X_1$ and $X_2$; m1 represents an integer of 1-3; and m2 represents an integer of 0-2, provided that m1+m2 is equal to 2 or 3.

4. The method of claim 1, comprising the step of:
conducting the annealing treatment via current.

5. The method of claim 1, comprising the step of:
conducting the annealing treatment via heat.

\* \* \* \* \*